(12) United States Patent
Takenaga et al.

(10) Patent No.: US 8,362,581 B2
(45) Date of Patent: Jan. 29, 2013

(54) MAGNETIC MEMORY ELEMENT AND MAGNETIC MEMORY DEVICE

(75) Inventors: Takashi Takenaga, Tokyo (JP); Taisuke Furukawa, Tokyo (JP); Takeharu Kuroiwa, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 9 days.

(21) Appl. No.: 13/073,552

(22) Filed: Mar. 28, 2011

(65) Prior Publication Data

US 2011/0233699 A1 Sep. 29, 2011

(30) Foreign Application Priority Data

Mar. 29, 2010 (JP) ................................. 2010-075349

(51) Int. Cl.
*H01L 29/82* (2006.01)
*G11C 11/14* (2006.01)

(52) U.S. Cl. ................. 257/421; 257/E29.323; 365/171
(58) Field of Classification Search .................. 257/421, 257/285, E29.323; 365/171, 173, 158
See application file for complete search history.

(56) References Cited

U.S. PATENT DOCUMENTS

| | | |
|---|---|---|
| 6,005,800 A | 12/1999 | Koch et al. |
| 6,165,803 A | 12/2000 | Chen et al. |
| 6,368,878 B1 | 4/2002 | Abraham et al. |
| 6,570,783 B1 | 5/2003 | Deak |
| 6,605,836 B2 | 8/2003 | Kishi et al. |
| 2003/0235068 A1 | 12/2003 | Deak |
| 2009/0250776 A1 | 10/2009 | Takenaga et al. |

FOREIGN PATENT DOCUMENTS

| | | |
|---|---|---|
| JP | 11-273337 | 10/1999 |
| JP | 2000-353791 | 12/2000 |
| JP | 2002-280637 | 9/2002 |
| JP | 2004-296858 A | 10/2004 |
| JP | 2005-310971 A | 11/2005 |

OTHER PUBLICATIONS

European Search Report and Opinion issued in European Patent Application No. 11154023.3, dated Jul. 4, 2011.
D.H. Mosca et al., "Oscillatory interlayer coupling and giant magnetoresistance in Co/Cu multilayers," Journal of Magnetism and Magnetic Materials 94 (1991) pp. L1-L5.
S.S.P. Parkin et al., "Oscillatory Magnetic Exchange Coupling through Thin Copper Layers," Physical Review Letters, vol. 66, No. 16, Apr. 22, 1991, pp. 2152-2155.

(Continued)

*Primary Examiner* — Thomas L Dickey
*Assistant Examiner* — Nikolay Yushin
(74) *Attorney, Agent, or Firm* — McDermott Will & Emery LLP

(57) ABSTRACT

Magnetic memory element includes recording layer changing magnetization direction by external magnetic field, having easy-axis and hard-axis crossing easy-axis, first conductive layer forming magnetic field in direction crossing direction of easy-axis at layout position of recording layer, second conductive layer extending in direction crossing first conductive layer and forming magnetic field in direction crossing direction of hard-axis at layout position of recording layer. Recording layer has at least part between first conductive layer and second conductive layer. Planar-shaped recording layer viewed from direction where first and second conductive layers and recording layer are laminated, has portion located on side and other portion located on other side, with respect to virtual first center line of first conductive layer along direction where first conductive layer extends viewed from lamination direction. Area of portion viewed from lamination direction is less than or equal to one-third area of other portion.

11 Claims, 15 Drawing Sheets

OTHER PUBLICATIONS

W.P. Pratt et al., "Perpendicular Giant Magnetoresistances of Ag/Co Multilayers," Physical Review Letters, vol. 66, No. 23, Jun. 10, 1991, pp. 3060-3063.

T. Miyazaki et al., "Giant magnetic tunneling effect in Fe/Al2O3/Fe junction," Journal of Magnetism and Magnetic Materials 139 (1995), pp. L231-L234.

S. Tehrani et al., "High density submicron magetoresistive random access memory (invited)," Journal of Applied Physics, vol. 85, No. 8, Apr. 15, 1999, pp. 5822-5827.

S.S.P. Parkin et al., "Exchanged-biased magnetic tunnel junctions and application to nonvolatile magnetic random access memory (invited)," Journal of Applied Physics, vol. 85, No. 8, Apr. 15, 1999, pp. 5828-5833.

ISSCC 2001 Dig. of Tech. Papers, pp. 122, Mar. 2001.

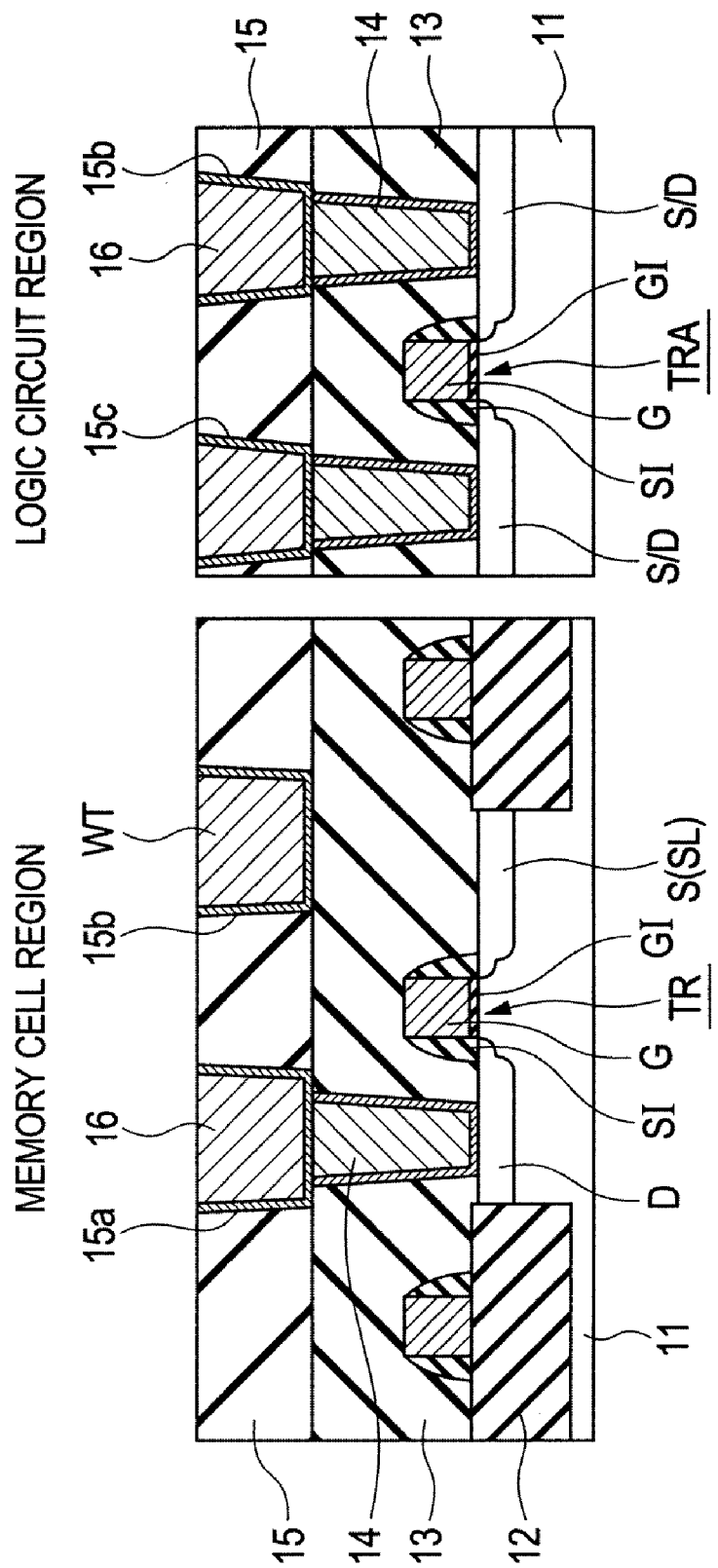

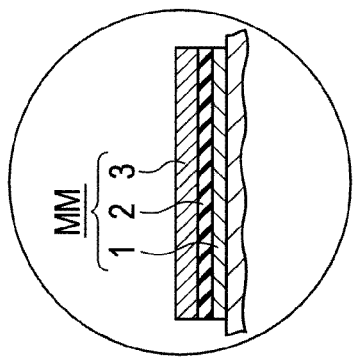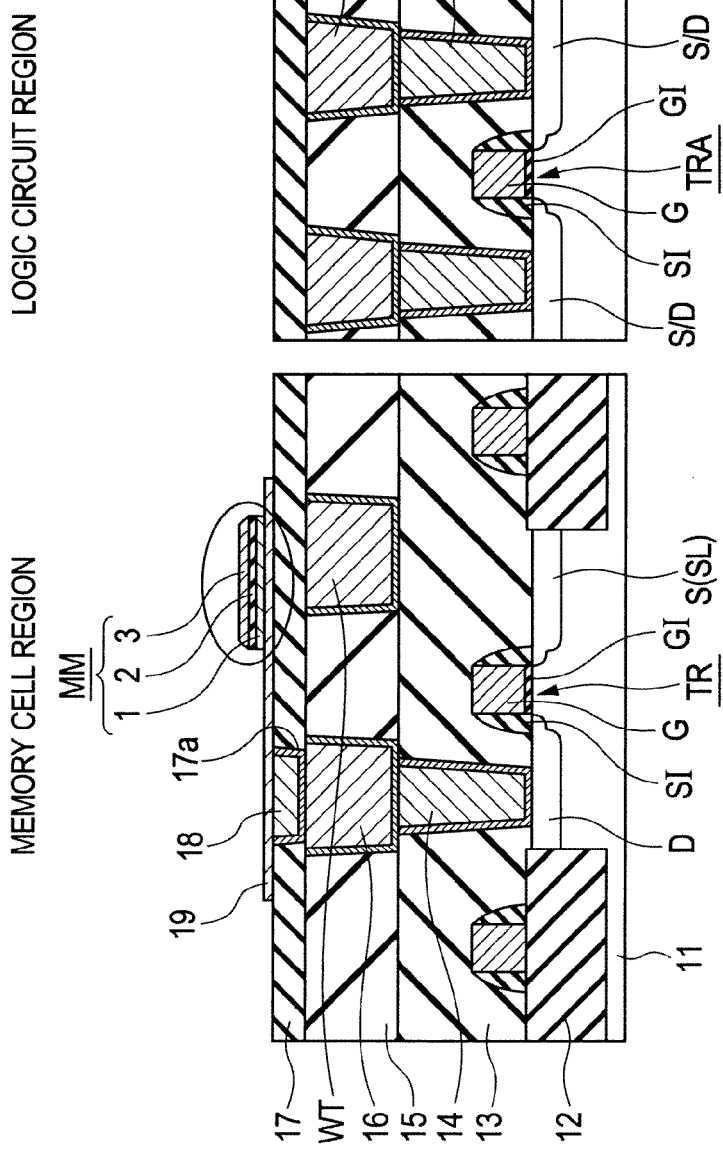

MAGNETIC MEMORY ELEMENT AND MAGNETIC MEMORY DEVICE

CROSS-REFERENCE TO RELATED APPLICATIONS

The disclosure of Japanese Patent Application No. 2010-75349 filed on Mar. 29, 2010 including the specification, drawings and abstract is incorporated herein by reference in its entirety.

BACKGROUND OF THE INVENTION

The present invention relates to a magnetic memory element and a magnetic memory device, and particularly to a magnetic memory element having a tunneling magnetoresistive effect and a magnetic memory device using the same.

The magnetoresistive (MR) effect is a phenomenon that the electric resistance is changed by applying a magnetic field to a magnetic substance, and is utilized for a magnetic field sensor, a magnetic head, and the like. Particularly, as giant magnetoresistance (GMR) effect materials exhibiting a very large magnetoresistive effect, artificial lattice films of Fe/Cr, Co/Cu, and the like have been introduced in non-patent documents 1 and 2 (D. H. Mosca et al., "Oscillatory interlayer coupling and giant magnetoresistance in Co/Cu multilayers", Journal of Magnetism and Magnetic Materials 94 (1991) pp. L1-L5, and S. S. P. Parkin et al., "Oscillatory Magnetic Exchange Coupling through Thin Copper Layers", Physical Review Letters, vol. 66, No. 16, 22 Apr. 1991, pp. 2152-2155).

There has also been proposed a magnetoresistive effect element using a lamination structure comprised of ferromagnetic layer/non-magnetic layer/ferromagnetic layer/antiferromagnetic layer having a non-magnetic metal layer which is thick to such a degree as to eliminate the exchange coupling action between the ferromagnetic layers. In this element, the ferromagnetic layer and the antiferromagnetic layer are exchange-coupled to each other. Thus, the magnetic moment of the ferromagnetic layer is fixed, so that only the spin of the other ferromagnetic layer can easily be reversed in the external magnetic field. This is an element known as a so-called spin valve film. With this element, the exchange coupling between the two ferromagnetic layers is weak and hence the spin can be reversed in a small magnetic field. For this reason, the spin valve film can provide a magnetoresistive element with a higher sensitivity than that of the exchange coupled film. As the antiferromagnetic substance, FeMn, IrMn, PtMn, or the like is used. The spin valve film causes an electric current to flow in the film in-plane direction for use, but is used for a reproducing head for high density magnetic recording because of such feature as described above.

On the other hand, a non-patent document 3 (W. P. Pratt et al., "Perpendicular Giant Magnetoresistances of Ag/Co Multilayers", Physical Review Letters, vol. 66, No. 23, 10 Jun. 1991, pp. 3060-3063) shows that the use of the perpendicular magnetoresistive effect of allowing an electric current to flow in the direction perpendicular to the film plane enables to obtain a further larger magnetoresistive effect.

Further, a non-patent document 4 (T. Miyazaki et al., "Giant magnetic tunneling effect in Fe/Al2O3/Fe junction", Journal of Magnetism and Magnetic Materials 139 (1995), pp. L231-L234) also shows a tunneling magnetoresistive (TMR) effect due to the ferromagnetic tunnel junction. This tunneling magnetoresistance is obtained by, in a three-layer film comprised of ferromagnetic layer/insulating layer/ferromagnetic layer, causing the spins of the two ferromagnetic layers to be parallel or anti-parallel to each other by the external magnetic field and thereby using a difference in magnitude between the tunnel currents in the direction perpendicular to the film plane.

In recent years, the studies on use of GMR and TMR elements for a nonvolatile magnetic memory semiconductor device (MRAM: magnetic random access memory) have been shown in, for example, non-patent documents 5 to 7 (S. Tehrani et al., "High density submicron magnetoresistive random access memory (invited)", Journal of Applied Physics, vol. 85, No. 8, 15 Apr. 1999, pp. 5822-5827; S. S. P. Parkin et al., "Exchange-biased magnetic tunnel junctions and application to nonvolatile magnetic random access memory (invited)", Journal of Applied Physics, vol. 85, No. 8, 15 Apr. 1999, pp. 5828-5833; and ISSCC 2001 Dig of Tech. Papers, p. 122).

In this case, a pseudo-spin valve element in which a non-magnetic metal layer is sandwiched between two ferromagnetic layers different in coercive force, and a ferromagnetic tunneling effect element have been studied. When these elements are used for an MRAM, they are arranged in a matrix form, and an electric current is made to flow into an additionally provided wire so that a magnetic field is applied thereto. Thus, the two magnetic layers forming each element are controlled to be parallel or anti-parallel to each other, so that "1" or "0" is recorded. Reading is performed by utilizing the GMR and TMR effects.

For an MRAM, the use of the TMR effect results in lower power consumption than the use of the GMR effect. Therefore, the use of the TMR element has been mainly studied. In an MRAM using a TMR element, the MR ratio of change is as large as 20% or more at room temperature, and the resistance at the tunnel junction is large. Therefore, a larger output voltage can be obtained. On the other hand, in the MRAM using such a TMR element, spin reversal is not required to be performed upon reading, so that reading is possible with the less current. For this reason, the MRAM using the TMR element has been expected as a low power consumption type nonvolatile semiconductor memory device capable of high-speed writing/reading.

As for the write operation of the MRAM, it is desired that the magnetic characteristics of the ferromagnetic layers in the TMR element are controlled. Specifically, there are demands for a technology of controlling the relative magnetization directions of two ferromagnetic layers interposing a non-magnetic layer therebetween to be parallel/anti-parallel, and a technology of making the magnetization reversal of one magnetic layer in a desired cell with reliability and efficiency. The technologies of controlling the relative magnetization directions of two ferromagnetic layers interposing a non-magnetic layer therebetween to be uniformly parallel/anti-parallel within the film plane by using two crossing wires have been shown in, for example, patent documents 1, 3, 4, and (Japanese Unexamined Patent Publication No. Hei 11 (1999)-273337, Japanese Unexamined Patent Publication No. 2000-353791, U.S. Pat. No. 6,005,800, and Japanese Unexamined Patent Publication No. 2005-310971).

In an MRAM, when cell miniaturization is performed for higher integration, the reversing magnetic field increases due to the demagnetizing field depending upon the size in the direction of the film plane of the magnetic layer. Thus, a large magnetic field is required for writing, and the power consumption also increases. Therefore, as shown in the patent documents 2, 5, 6, and (Japanese Unexamined Patent Publication No. 2002-280637, Japanese Unexamined Patent Publication No. 2004-296858, U.S. Pat. No. 6,570,783, and Japanese Unexamined Patent Publication No. 2005-310971), there have been proposed technologies wherein the shape of the ferromagnetic layer is optimized thereby to facilitate magnetization reversal.

When miniaturization of a magnetic memory element is carried out with higher integration for an MRAM, a larger magnetic field is required for writing due to the effect of the demagnetizing field. Therefore, the effect of the magnetic field exerted on the periphery of the selected magnetic memory element becomes large, and erroneous magnetization reversal becomes pronounced. In order to cope with it, there has been proposed in, for example, the patent document (Japanese Unexamined Patent Publication No. 2000-353791), that a wire covered with a material of high magnetic permeability as in Permalloy is formed and a TMR element is caused to concentrate the magnetic field thereon.

SUMMARY OF THE INVENTION

In the MRAM, the other magnetic memory element placed on the same write line as that of a magnetic memory element subjected to writing is also brought to a half-selection state upon a write operation. In the half-selection state, a magnetic field is applied even to the other magnetic memory element disposed on the same write line as that of the magnetic memory element by a write line current.

In the MRAM, fluctuations occur in the shape of a recording layer of each magnetic memory element at each of a plurality of MRAM memory cells arranged in a matrix form, due to the photolithography and etching in the manufacturing process steps of the magnetic memory element. Therefore, the magnetic field for saturating the magnetization of the recording layer becomes small depending upon the shape of the recording layer in the magnetic memory element. For this reason, when the recording layer in which the magnetic field for saturating the magnetization thereof is small is brought to the half-selection state by the write line current, the magnetization of the recording layer is saturated in the direction of a hard-axis of magnetization due to the magnetic field generated by the write line current. When the write line current reaches zero after the magnetization of the recording layer has been saturated, the magnetization of the recording layer assumes either of both directions along an easy-axis of magnetization, but their probabilities become ideally 1/2. It is therefore not possible to hold information because the magnetization of the recording layer cannot be controlled. Accordingly, a problem arises in that erroneous inversion of data in the magnetic memory element takes place.

The present invention has been made in view of the foregoing problem. An object of the present invention is to provide a magnetic memory element capable of suppressing erroneous inversion of data in the magnetic memory element brought to a half-selection state thereby to perform a highly reliable write operation, and a magnetic memory device using the magnetic memory element.

A magnetic memory element of the present invention comprises a recording layer capable of changing in magnetization direction by an external magnetic field, and having an easy-axis of magnetization and a hard-axis of magnetization crossing with the easy-axis; a first conductive layer for forming a magnetic field in the direction crossing with the direction of the easy-axis at a layout position of the recording layer; and a second conductive layer extending in the direction crossing with the first conductive layer and for forming a magnetic field in the direction crossing with the direction of the hard-axis at the layout position of the recording layer. The recording layer has at least part placed so as to be interposed between the first conductive layer and the second conductive layer. A planar shape of the recording layer as viewed from the direction in which the first and second conducive layers and the recording layer are laminated with each other, has one portion located on one side and the other portion located on the other side, with respect to a virtual first center line of the first conductive layer along the direction in which the first conducive layer extends as viewed from the lamination direction. The area of one portion as viewed from the lamination direction is less than or equal to one-third that of the other portion.

According to the present invention, the planar shape of the recording layer as viewed from the lamination direction has one portion located on one side and the other portion located on the other side, with respect to the virtual first center line of the first conductive layer along the direction in which the first conducive layer extends as viewed from the lamination direction. The area of one portion as viewed from the lamination direction is less than or equal to one-third that of the other portion. Therefore, a magnetic field applied to the other portion by a write line current becomes small. For this reason, the magnetization of the recording layer is not saturated. Accordingly, the magnetic memory element can maintain the direction of magnetization prior to the flow of the write line current. It is therefore possible to suppress erroneous inversion of data in the magnetic memory element brought to a half-selection state. As a result, a highly reliable write operation can be carried out.

BRIEF DESCRIPTION OF THE DRAWINGS

FIG. 9 is a schematic sectional view showing a third process of the method shown in FIG. 7;

FIGS. 10A and 10B are respectively a schematic sectional view showing a fourth process step of the method shown in FIG. 7 and an enlarged sectional view showing a ferromagnetic tunnel junction element portion in enlarged form;

DETAILED DESCRIPTION OF THE PREFERRED EMBODIMENTS

Preferred embodiments of the present invention will be explained below based on the accompanying drawings.
(First Embodiment)
(Circuit and Structure of Memory Cell)

First, as for a magnetic memory device according to a first embodiment of the present invention, a description will be given to the memory cell circuit of the magnetic memory device.

Figure 1:
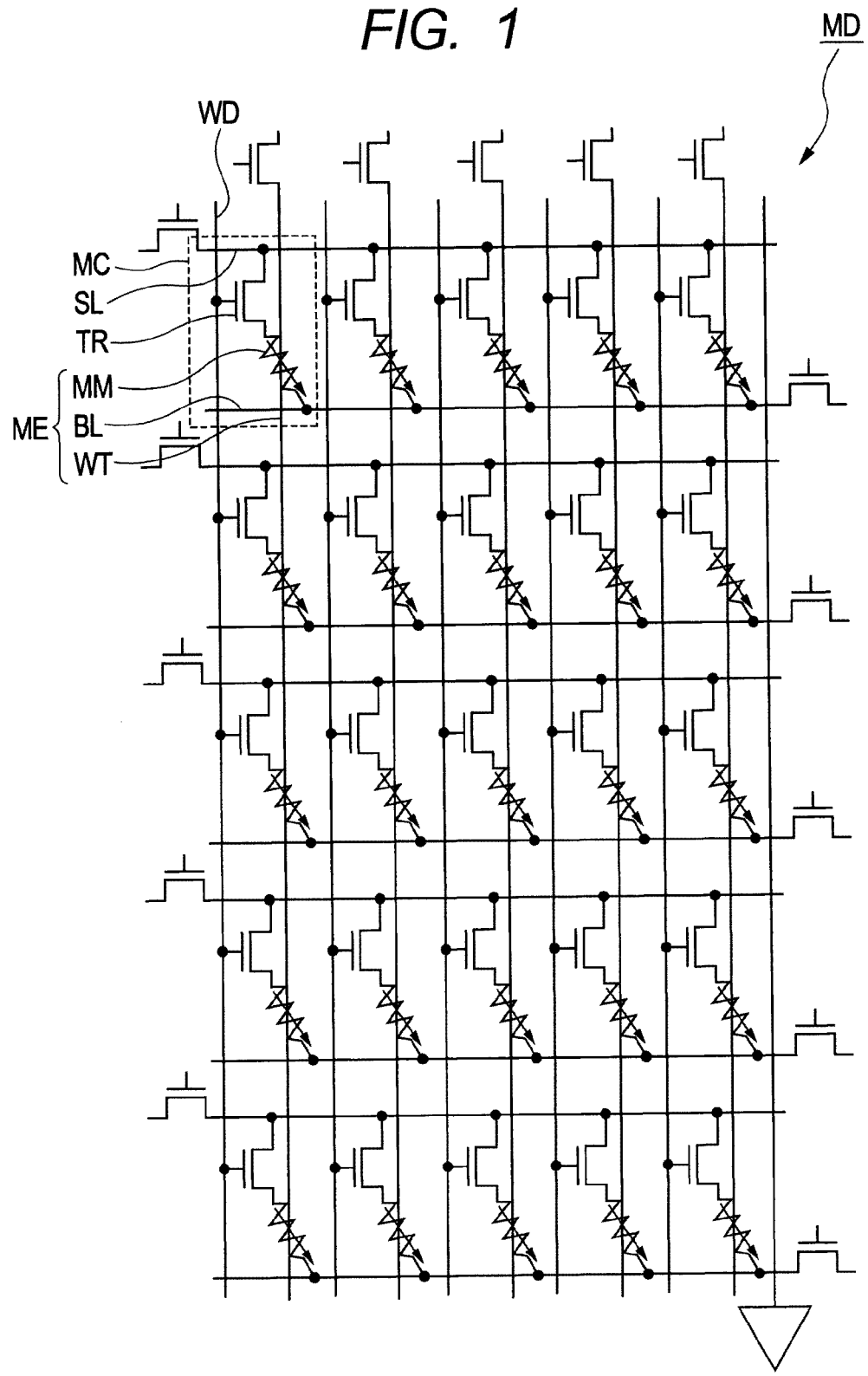
FIG. 1 is a circuit diagram of memory cells of a magnetic memory device according to a first embodiment of the present invention.

Referring to FIG. 1, in the magnetic memory device MD, one memory cell MC (within the dotted line frame) comprises an element selection transistor TR and a ferromagnetic tunnel junction element MM. A plurality of the memory cells MC are formed in a matrix.

Each magnetic memory element ME includes a ferromagnetic tunnel junction element MM, and a write line WT and a bit line BL for performing rewriting and reading of information. The element selection transistor TR is of a control element for controlling the magnetic memory element ME. The bit line BL is electrically coupled to respective one end sides of the ferromagnetic tunnel junction elements MM arranged side by side in one direction (e.g., row).

On the other hand, the write lines WT are arranged in the direction perpendicular to the bit lines BL along the other direction (e.g. column). The other end side of the ferromagnetic tunnel junction element MM is electrically coupled to the drain side of the element selection transistor TR. The source sides of the element selection transistors TR arranged side by side in one direction are electrically coupled to one another by source lines SL. The gates of the element selection transistors TR arranged side by side in the other direction are electrically coupled to one another by a word line WD.

The structure of the magnetic memory device according to the present embodiment will next be described.

Figure 2:
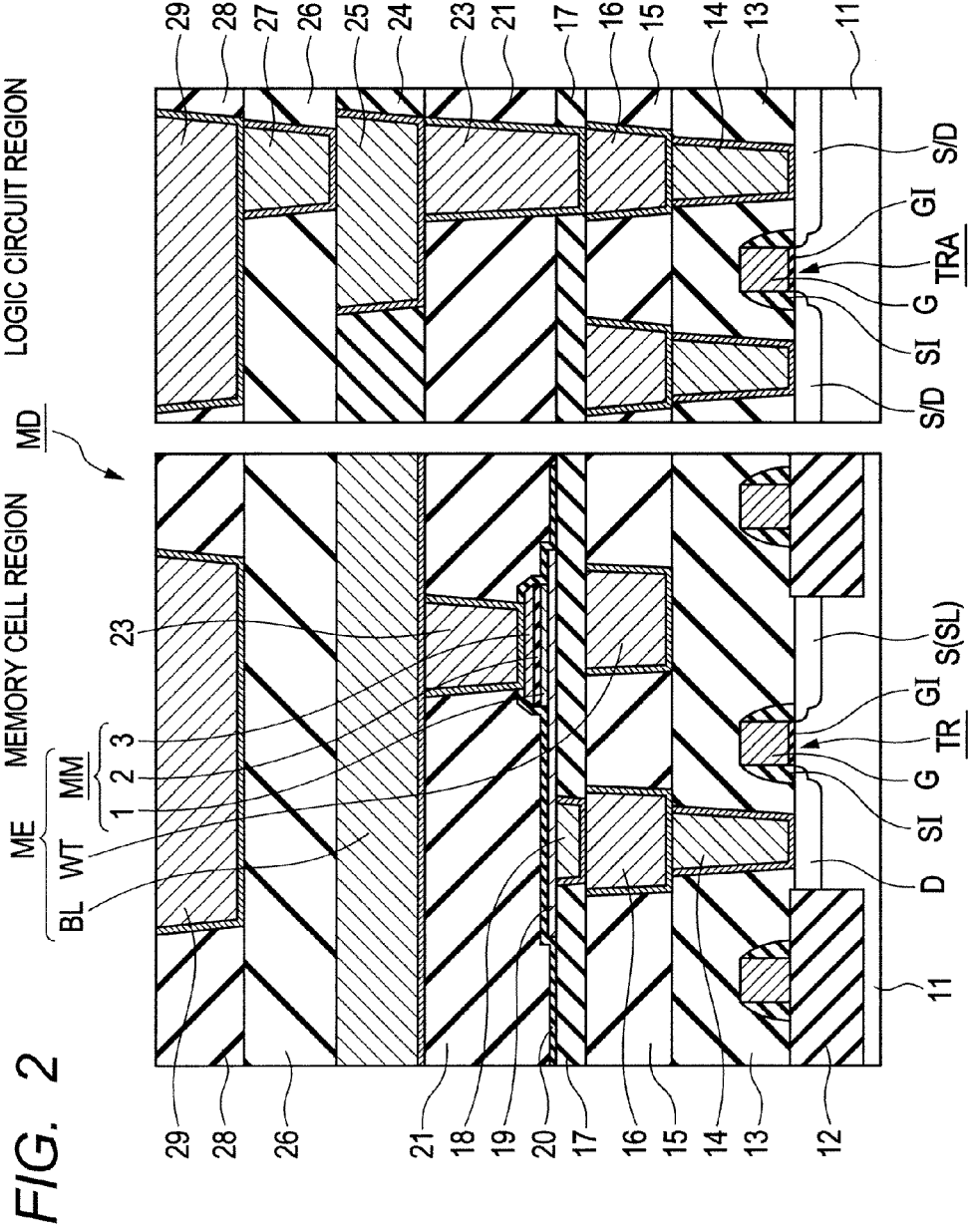
FIG. 2 is a schematic sectional view illustrating the configuration of the magnetic memory device according to the first embodiment of the present invention.

Referring to FIG. 2, in a memory cell region MR of a semiconductor substrate 11, an element selection transistor TR is formed in the surface (surface of the semiconductor substrate 11) defined by an element isolation insulating film 12. The element selection transistor TR principally has a drain region D, a source region S and a gate electrode main body G. The drain region D and the source region S are formed in the surface of the semiconductor substrate 11 with being spaced a prescribed distance apart from each other. The drain region D and the source region S are mutually formed of impurity regions of a prescribed conductivity type. The gate electrode main body G is formed over the region interposed between the drain region D and the source region S via a gate insulating film GI. The sidewall of the gate electrode main body G is covered with a sidewall-like sidewall insulating film SI.

An interlayer insulating film 13 is formed so as to cover the element selection transistor TR. The interlayer insulating film 13 is provided with a trench or hole that reaches from its top side to the drain region D. A coupling member 14 is formed within the hole. An interlayer insulating film 15 is formed over the interlayer insulating film 13. In the interlayer insulating film 15, there are formed a hole that reaches from the top side of the interlayer insulting film 15 to the coupling member 14, and a hole that reaches the interlayer insulating film 13 from the top side thereof. The write line WT and a coupling member 16 are formed in their corresponding holes. The coupling member 16 is electrically coupled to the drain region D by the coupling member 14.

An interlayer insulating film 17 is formed over the interlayer insulating film 15 so as to cover the write line WT and the coupling member 16. The interlayer insulating film 17 includes a hole provided therein, reaching the coupling member 16 from its top side. A coupling member 18 is formed in the hole. A conductive layer 19 and a ferromagnetic tunnel junction element MM are formed over the interlayer insulating film 17. The conductive layer 19 is electrically coupled to the drain region D by the coupling members 18, 16 and 14.

The ferromagnetic tunnel junction element MM is a magnetoresistive effect element, and has a pinned layer 1, a tunnel insulting layer 2 which is a non-magnetic layer, and a recording layer 3, sequentially stacked from the bottom. The pinned layer 1 is formed to be in contact with the conductive layer 19.

A protective film 20 is formed in such a manner as to cover the ferromagnetic tunnel junction element MM. An interlayer insulating film 21 is formed over the protective film 20. The protective film 20 and the interlayer insulting film 21 include a hole provided therein, penetrating these films 20 and 21 and reaching the recording layer 3. In the hole, a coupling member 23 is formed. The bit line BL is formed over the interlayer insulating film 21. The bit line BL is electrically coupled to the ferromagnetic tunnel junction element MM by the coupling member 23.

An interlayer insulating film 26 is formed in such a manner as to cover the bit line BL. A prescribed wiring layer 29 and insulating layer 28 are formed over the interlayer insulating film 26.

On the other hand, a transistor TRA that forms a logic circuit is formed in a peripheral (logic) circuit region RR of the semiconductor substrate 11. The transistor TRA has a pair of source/drain regions S/D formed in the surface of the semiconductor substrate 11 with being spaced a prescribed distance apart from each other, and a gate electrode G formed over the region interposed between the pair of source/drain regions S/D via a gate insulating film GI interposed therebetween. The sidewall of the gate electrode G is covered with a sidewall-like sidewall insulating film SI.

Prescribed wiring layers 16, 25 and 29, coupling members 14, 23 and 27 for electrically coupling the wiring layers 16, 25 and 29, and the interlayer insulating films 13, 15, 17, 21, 24, 26 and 28 are formed over the transistor TRA.

The structure of the memory cell will next be described in more detail.

Figure 3:
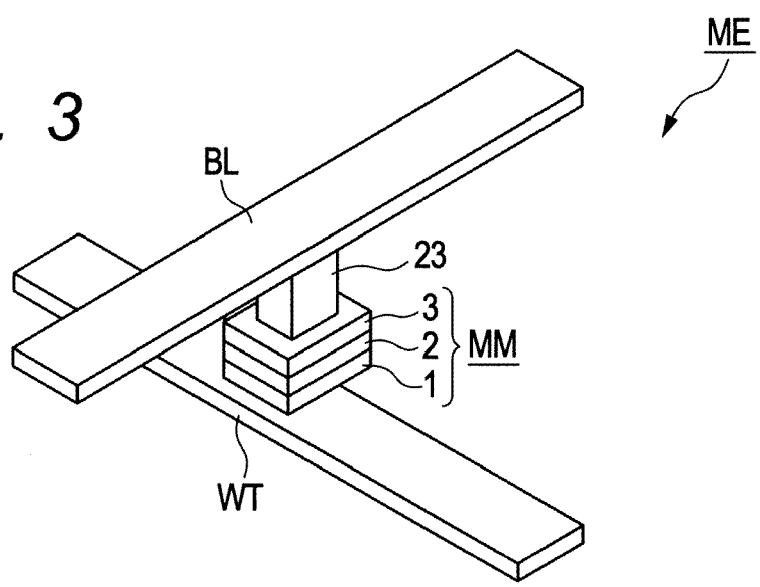
FIG. 3 is a perspective view schematically depicting the configuration of a magnetic memory element employed in the first embodiment of the present invention.
Figure 4:
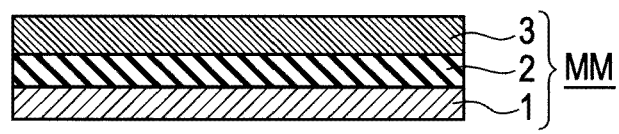
FIG. 4 is a sectional view schematically showing the configuration of a ferromagnetic tunnel junction element employed in the first embodiment of the present invention.

Referring to FIGS. 3 and 4, the ferromagnetic tunnel junction element MM to be magnetized for information is arranged in such a manner as to be at least partially interposed between the write line WT and the bit line BL from the upper and lower directions in a region in which the write line WT and the bit line BL (first and second conductive layers) cross each other. The ferromagnetic tunnel junction element MM is formed in a lamination structure of, for example, the pinned layer 1, the tunnel insulating layer 2 and the recording layer 3. In the pinned layer 1, the direction of magnetization is fixed. The recording layer 3 enables a change in the direction of magnetization by an external magnetic field. In the recording layer 3, the direction of magnetization is changed by a magnetic field generated by the electric current flowing through a prescribed wire (e.g., the bit line BL), and injection of spin-polarized electrons.

The pinned layer 1 is electrically coupled to the drain region D of the element selection transistor TR via the conductive layer 19 and the coupling members 18, 16 and 14 as shown in FIG. 2. On the other hand, the recording layer 3 side is electrically coupled to the bit line BL via the coupling member 23.

As for the recording layer 3 in which the direction of magnetization is changed by a magnetic field applied from outside, there is generally a direction in which magnetization tends to occur according to the crystal structure, shape or the like. This direction is in a state in which magnetic energy is low. The direction in which magnetization tends to occur is referred to as an Easy-axis (Ea). In contrast, the direction in which magnetization is less likely to occur is referred to as a Hard-axis (Ha).

Figure 5:
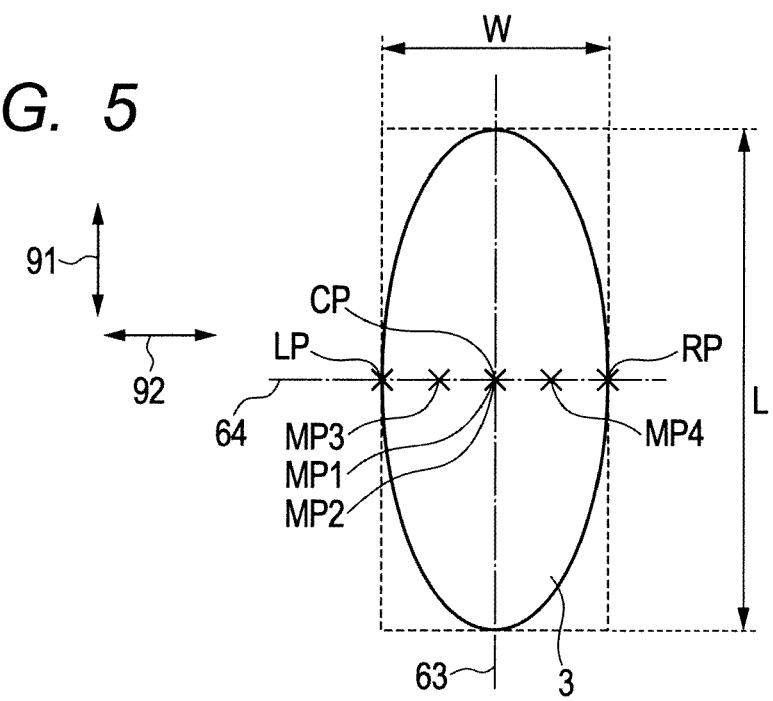
FIG. 5 is a schematic plan view illustrating a planar shape of a recording layer employed in the first embodiment of the present invention.

The outline of the planar shape of the recording layer will be explained referring to FIG. 5. As one embodiment related to the recording shape as seen in the plan, there is such an elliptical shape as shown in FIG. 5. As shown in FIG. 5, the recording layer 3 has an easy-axis 91 and a hard-axis 92 which intersects with the easy-axis 91. The recording layer 3 has a virtual first straight line 63 having the planar-shaped maximum length L extending along the direction of the easy-axis 91. Namely, the virtual first straight line 63 extends to the position where the length of the recording layer 3 in the direction of the easy-axis 91 becomes the maximum. The recording layer 3 has the maximum length L over the virtual first straight line 63.

The recording layer 3 has a virtual second straight line 64 which passes through a first midpoint MP1 of the virtual first straight line 63 and has a planar-shaped length W extending along the direction of the hard-axis 92. Namely, the virtual second straight line 64 is a straight line perpendicular to the virtual first straight line 63 and is located so as to equally divide the portion of the maximum length L of the virtual first straight line 63. A center point CP lies in a second midpoint MP2 of the virtual second straight line 64. Namely, the center point CP is located at the point of intersection between the virtual first straight line 63 and the virtual second straight line 64.

Both ends planar in shape, which are located on the virtual second straight line 64, are assumed to be one end LP and the other end RP. Namely, the crossing positions at which the virtual second straight line 64 and both planar-shaped ends of the recording layer 3 intersect are assumed to be one end LP and the other end RP. The center point CP lies in the midpoint of a distance between one end LP and the other end RP. The midpoint between the center point CP and one end LP is assumed to be a third midpoint MP3, and the midpoint between the center point CP and the other end RP is assumed to be a fourth midpoint MP4.

Figure 6:
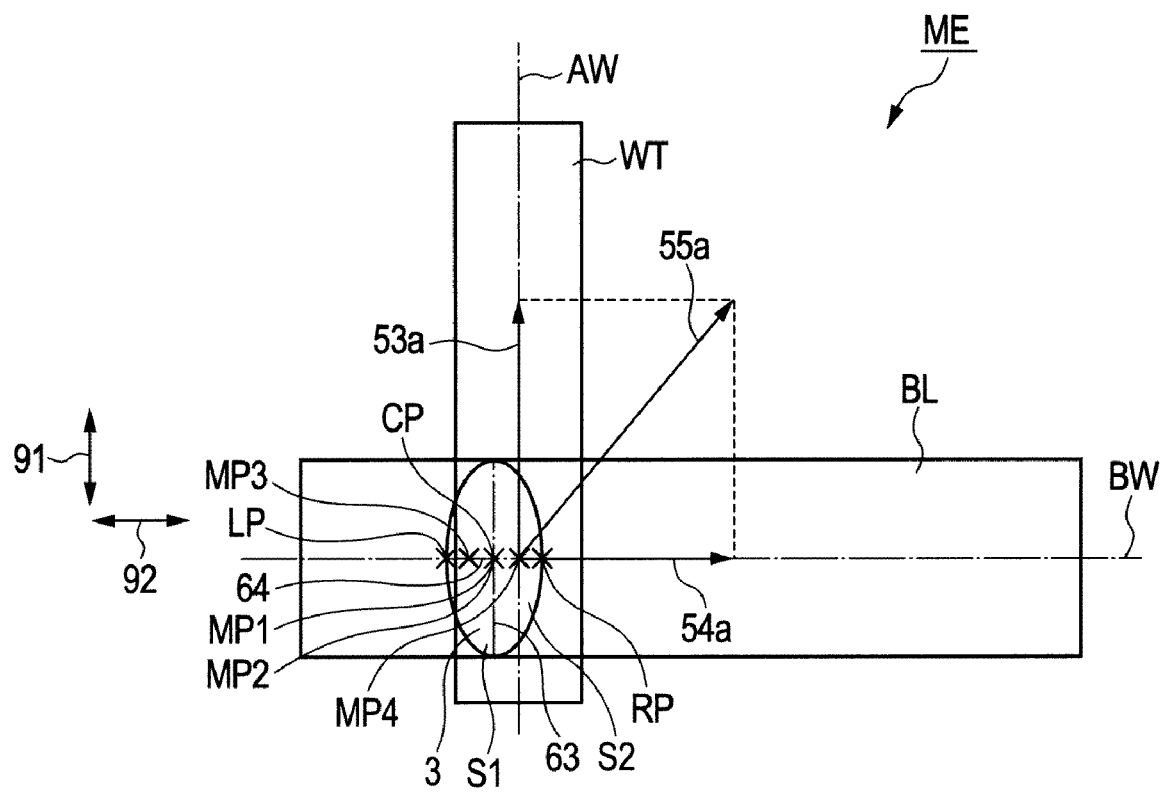
FIG. 6 is a diagram for explaining the position of the recording layer employed in the first embodiment of the present invention and is a diagram of the magnetic memory element as viewed from its lamination direction.
Figure 7:
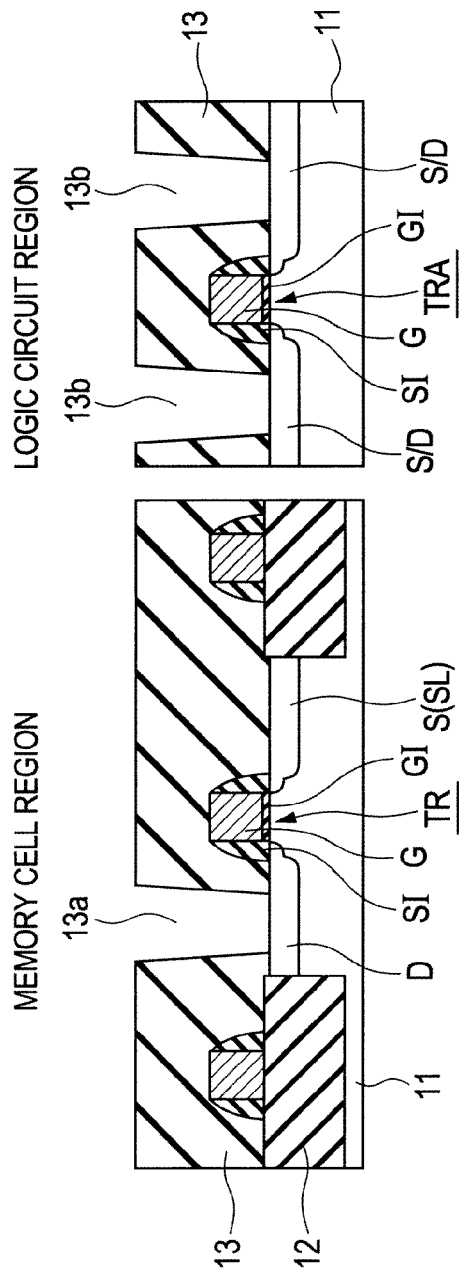
FIG. 7 is a schematic sectional view showing a first process step of a method for manufacturing the magnetic memory device according to the first embodiment of the present invention.

Referring to FIG. 6, the write WT is provided to form a magnetic field in the direction intersecting the direction of the easy-axis 91 at the layout position of the recording layer 3. The write line WT extends along a virtual first center line AW. The bit line BL extends in the direction that intersects the write line WT and is provided to form a magnetic field in the direction intersecting the direction of the hard-axis 92 at the layout position of the recording layer 3. The bit line BL extends along a virtual second center line BW.

The recording layer 3 is arranged in such a manner that the direction of the easy-axis 91 becomes substantially parallel to the direction in which the virtual first center line AW extends. Namely, the recording layer 3 is arranged in such a manner that its longitudinal direction becomes nearly parallel to the direction in which the write line WT extends. Further, the recording layer 3 is arranged in such a manner that the direction of the hard-axis 92 thereof becomes substantially parallel to the direction in which the virtual second center line BW extends. In the present embodiment, the recording layer 3 is formed in such a way that the direction (direction in which the write line WT extends) in which the virtual first center line AW extends, and the direction (direction in which the bit line BL extends) in which the virtual second center line BW extends, become nearly vertical to each other.

The planar shape of the recording layer 3 as viewed from the direction in which the write line WT and the bit line BL, and the writing layer 3 are laminated, has one portion located on one side and the other portion located on the other side relative to the first center line AW in the direction in which the write line WT extends as viewed from the lamination direction. The area S2 of the one portion as viewed from the lamination direction is less than or equal to one third the area S1 of the other portion. The area S2 of the one portion corresponds to a planar-shaped area located on the other end RP side of the virtual first center line AW, and the area S1 of the other portion corresponds to a planar-shaped area located on the one end LP side of the virtual first center line AW. When only the magnetic field formed by the write line WT acts on the recording layer 3, the recording layer 3 is formed in such a manner that magnetization is not saturated.

As viewed from the direction in which the write line WT and the bit line BL, and the recording layer 3 are laminated, the center point CP in the recording layer 3 is disposed in the region interposed between the write line WT and the bit line BL and disposed with being shifted from the first center line AW. The center point CP in the recording layer 3 is substantially located over the second center line BW of the bit line BL as viewed from the lamination direction.

The width of the write line WT as viewed from the lamination direction is formed larger than both the distance between the center point CP and the one end LP and the distance between the center point CP and the other end RP and smaller than the distance equal to twice the distance between the one end LP and the other end RP. The first center line AW of the write line WT passes over the fourth midpoint MP4 as viewed from the lamination direction. Incidentally, the virtual first center line AW of the write line WT may pass over the third midpoint MP3 as viewed from the lamination direction.

The other end RP is arranged with being interposed between the write line WT and the bit line BL as viewed from the lamination direction. The one end LP is not arranged with being interposed between the write line WT and the bit line BL as viewed from the lamination direction.

(Operation of Memory Cell)

Then, the operation of a memory cell will be described.

Referring to FIG. 2, the read operation is performed in the following manner. A prescribed electric current is made to flow through the ferromagnetic tunnel junction element MM of a specific memory cell. Thus, the difference in resistance value due to the direction of magnetization is detected. First, the selection transistor TR of a specific memory cell is set in ON state. Thus, a prescribed sense signal is transferred from the bit line BL through the specific ferromagnetic tunnel junction element MM to the source line SL via the coupling members 18, 16, and 14, and the selection transistor TR.

At this time, when the directions of magnetization of the recording layer 3 and the pinned layer 1 in the ferromagnetic tunnel junction element MM are the same direction (parallel), the resistance value is relatively low. When the directions of magnetization of the recording layer 3 and the pinned layer 1 are opposite to each other (anti-parallel), the resistance value is relatively high. The tunneling magnetoresistive effect element has the characteristics that when respective magnetization directions of the recording layer 3 and the pinned layer 1 are parallel with each other, the resistance value becomes small, and when respective magnetization directions of the recording layer 3 and the pinned layer 1 are anti-parallel with each other, the resistance value becomes large.

As a result, when the directions of magnetization of the ferromagnetic tunnel junction element MM are parallel with each other, the intensity of the sense signal flowing through the source line SL becomes larger than the signal intensity of a prescribed reference memory cell. On the other hand, when the directions of magnetization of the ferromagnetic tunnel junction element MM are anti-parallel with each other, the intensity of the sense signal becomes smaller than the signal intensity of the prescribed reference memory cell. Thus, whether the information written in a specific memory cell is "0" or "1" is determined depending on whether the intensity of the sense signal is larger or smaller than the signal intensity of the prescribed reference memory cell.

The write (rewrite) operation is performed in the following manner. A prescribed electric current is made to flow through the bit line BL and the write line WT, thereby to magnetize (cause magnetization reversal in) the ferromagnetic tunnel junction element MM. First, a prescribed electric current is made to flow through the selected bit line BL and write line WT respectively. This generates respective magnetic fields (arrows 53a and 54a of FIG. 6) corresponding to the directions of flows of the electric current around the bit line BL and the write line WT. Thus, a synthetic magnetic filed (arrow 55a of FIG. 6) of the magnetic field generated by the electric current flowing through the bit line BL and the magnetic field generated by the electric current flowing through the write line WT acts on the ferromagnetic tunnel junction element MM located in the region in which the selected bit line BL and write line WT cross each other.

At this time, there are, based on the sum of the magnetic field, an embodiment in which the recording layer 3 of the ferromagnetic tunnel junction element MM is magnetized in the same direction as the direction of magnetization of the pinned layer 1, and an embodiment in which the recording layer 3 is magnetized in the opposite direction to the direction of magnetization of the pinned layer 1. The case where the directions of magnetization of the recording layer 3 and the pinned layer 1 are the same direction (parallel), and the case of the opposite directions (anti-parallel) are realized in this way. Thus, the direction of magnetization is recorded as information corresponding to "0" or "1".

(Manufacturing Method of Magnetic Memory Device)

A description will next be given to one example of the magnetic memory device and the manufacturing method thereof.

FIGS. 7 through 11 are schematic sectional views showing the manufacturing method of the magnetic memory device according to the present embodiment in a process step sequence. First, by reference to FIG. 7, the element isolation insulating film 12 is formed in a prescribed region in the main surface of the semiconductor substrate 11. As a result, the memory cell region MR and the peripheral circuit region RR are formed. The gate electrode main body G is formed over the surface of the semiconductor substrate 11 located in the memory cell region MR and the peripheral circuit region RR via the gate insulating film GI. Using the gate electrode main body G and the like as a mask, impurities of a prescribed conductivity type are introduced into the surface of the semiconductor substrate 11 to thereby form the drain region D and the source region S comprised of an impurity region, and a pair of source/drain regions S/D. Thus, in the memory cell region MR, the element selection transistor TR including the gate electrode G, the drain region D and the source region S is formed. In the peripheral circuit region RR, the transistor TRA forming the logic circuit is formed.

The interlayer insulating film 13 is formed by, for example, a CVD (Chemical Vapor Deposition) method in such a manner as to cover the element selection transistor TR and the transistor TRA. The interlayer insulating film 13 is subjected to a prescribed photomechanical process and etching, thereby to form contact holes 13a and 13b that expose the surface of the semiconductor substrate 11. For example, a tungsten layer (not shown) is formed over the interlayer insulating film 13 in such a manner as to fill the contact holes 13a and 13b. The tungsten layer is subjected to a CMP (Chemical Mechanical Polishing) process, so that the portion of the tungsten layer located over the top side of the interlayer insulating film 13 is removed.

Figure 8:
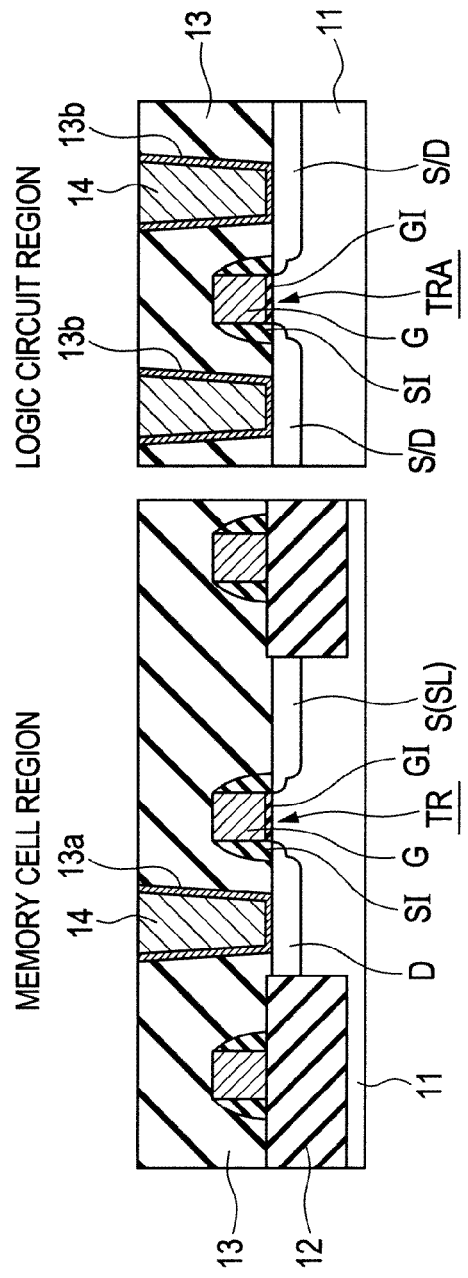
FIG. 8 is a schematic sectional view showing a second process step of the method shown in FIG. 7.

Referring to FIG. 8, by the removal of the tungsten layer, the tungsten layer is left in each of the contact holes 13a and 13b to form a coupling member 14.

Referring to FIG. 9, the interlayer insulting film 15 is further formed over the interlayer insulating film 13 by, for example, a CVD method. The interlayer insulating film 15 is subjected to a prescribed photomechanical process and etching, so that in the memory cell region MR, openings 15a and 15b for forming a write line and a prescribed wiring layer are formed. Whereas, in the peripheral circuit region RR, an opening 15c for forming a prescribed wiring layer is formed in the interlayer insulating film 15. For example, a copper layer (not shown) is formed over the interlayer insulation film 15 in such a manner as to fill the openings 15a, 15b, and 15c. The copper layer is subjected to a CMP process, so that the copper layer located over the top side of the interlayer insulating film 15 is removed. Thus, the copper layer is left in the openings 15a, 15b, and 15c. Accordingly, in the memory cell region MR, a coupling member 16 is formed in the opening 15a, and a write line WT is formed in the opening 15b. Whereas, in the peripheral circuit region RR, the wiring layer 16 is formed in the opening 15c.

Figure 12:
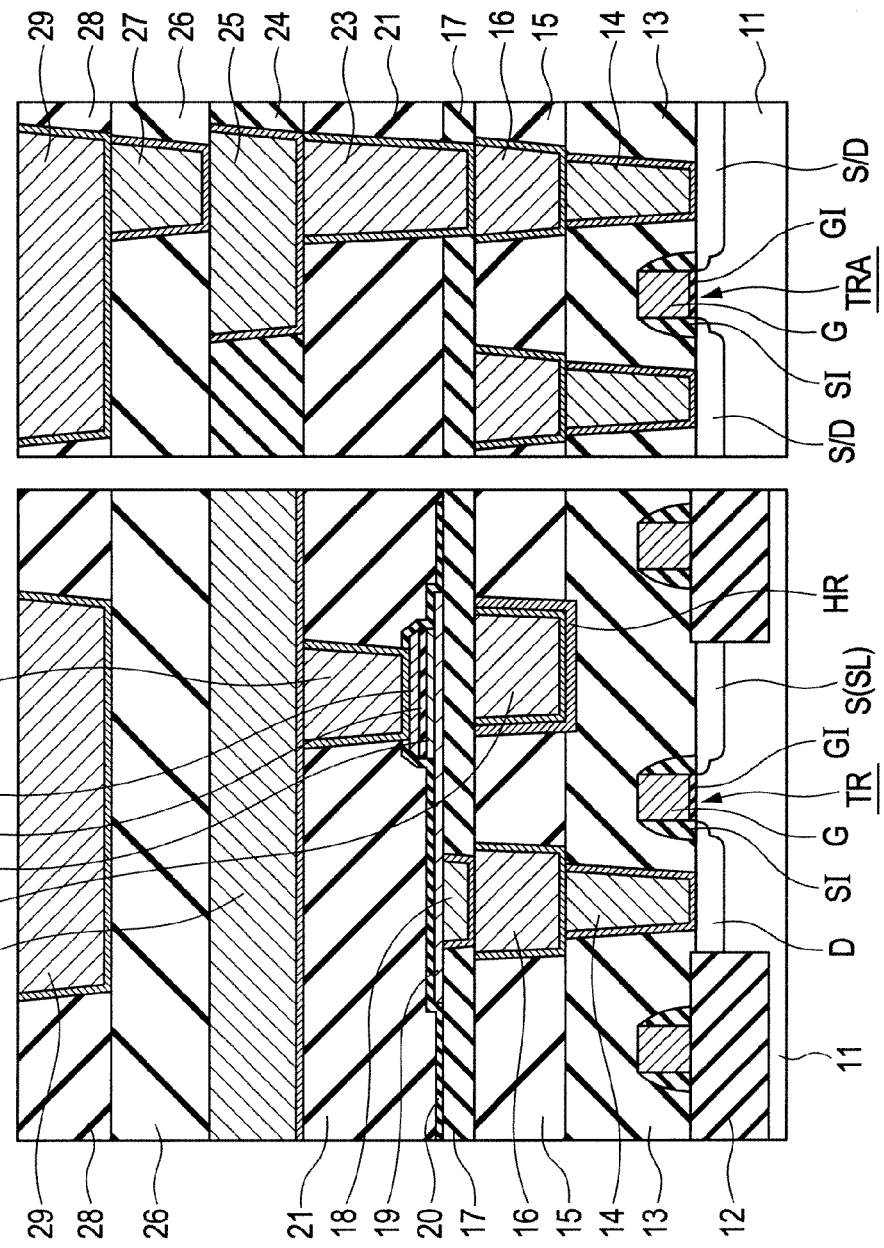
FIG. 12 is a schematic sectional view illustrating the configuration of the magnetic memory device according to the first embodiment of the present invention and is a schematic sectional view of the magnetic memory device in whose magnetic memory element is provided with a covering layer.

Incidentally, for the formation of the copper layer to fill the openings 15a, 15b, and 15c, a reaction preventive layer for preventing the reaction between the copper layer and the interlayer insulating film may be stacked. Further, by reference to FIG. 12, a covering layer HR comprised of a material having magnetic permeability higher than that of the write line WT may be formed in such a manner as to cover the wire line WT in order to concentrate a wiring current magnetic field on the magnetic memory element.

Referring to FIGS. 10(a) and 10(b), the interlayer insulating film 17 is further formed over the interlayer insulating film 15 by, for example, a CVD method. The interlayer insulating film 17 is subjected to a prescribed photomechanical process and etching, so that a contact hole 17a exposing the surface of the coupling member 16 is formed. For example, a copper layer (not shown) is formed over the interlayer insulating film 17 in such a manner as to fill the inside of the contact hole 17a. The copper layer is subjected to, for example, a CMP process, so that the copper layer located over the top side of the interlayer insulating film 17 is removed. Thus, the copper layer is left in the contact hole 17a, thereby to form the coupling member 18.

Then, the conductive layer 19 and the ferromagnetic tunnel junction element MM are formed over the interlayer insulating film 17 in the memory cell region MR. The ferromagnetic tunnel junction element MM is comprised of a lamination film of the pinned layer 1, the tunnel insulating layer 2, and the recording layer 3. First, as a film to be the pinned layer 1, for example, a platinum manganese film (antiferromagnetic layer) with a film thickness of about 20 nm, and a cobalt alloy film (ferromagnetic film) with a film thickness of about 3 nm are successively formed. Subsequently, as a film to be the tunnel insulating layer 2, for example, an aluminum oxide film with a film thickness of about 1 nm is formed. Then, as the recording layer 3, for example, a nickel alloy film with a film thickness of about 3 nm is formed (both are not shown). Incidentally, the platinum manganese film, the cobalt alloy film, the aluminum oxide film, and the nickel alloy film are formed by, for example, a sputtering method.

Thereafter, the nickel alloy film, the aluminum oxide film, the cobalt alloy film, and the platinum manganese film are subjected to a prescribed photomechanical process and etching. This results in the formation of a ferromagnetic tunnel junction element MM in a prescribed shape including the pinned layer 1, the tunnel insulating layer 2, and the recording layer 3. Generally, when a dry process (asking) is used for removal of a resist pattern after etching, a gas containing oxygen as a main component is used. Preferably, gases not oxidative with respect to the constituent materials of the pinned layer 1 and the recording layer 3, such as hydrogen, nitrogen, and ammonia, and their mixture gases are used. Accordingly, oxidation of the pinned layer 1 and the recording layer 3 are suppressed.

Incidentally, the pinned layer 1 may be in a lamination structure of antiferromagnetic layer/ferromagnetic layer/non-magnetic layer/ferromagnetic layer. No problem arises even if the recording layer 3 is formed in a lamination of ferromagnetic films having different magnetic characteristics, or in a lamination structure of ferromagnetic layer/non-magnetic layer/ferromagnetic layer.

Figure 11:
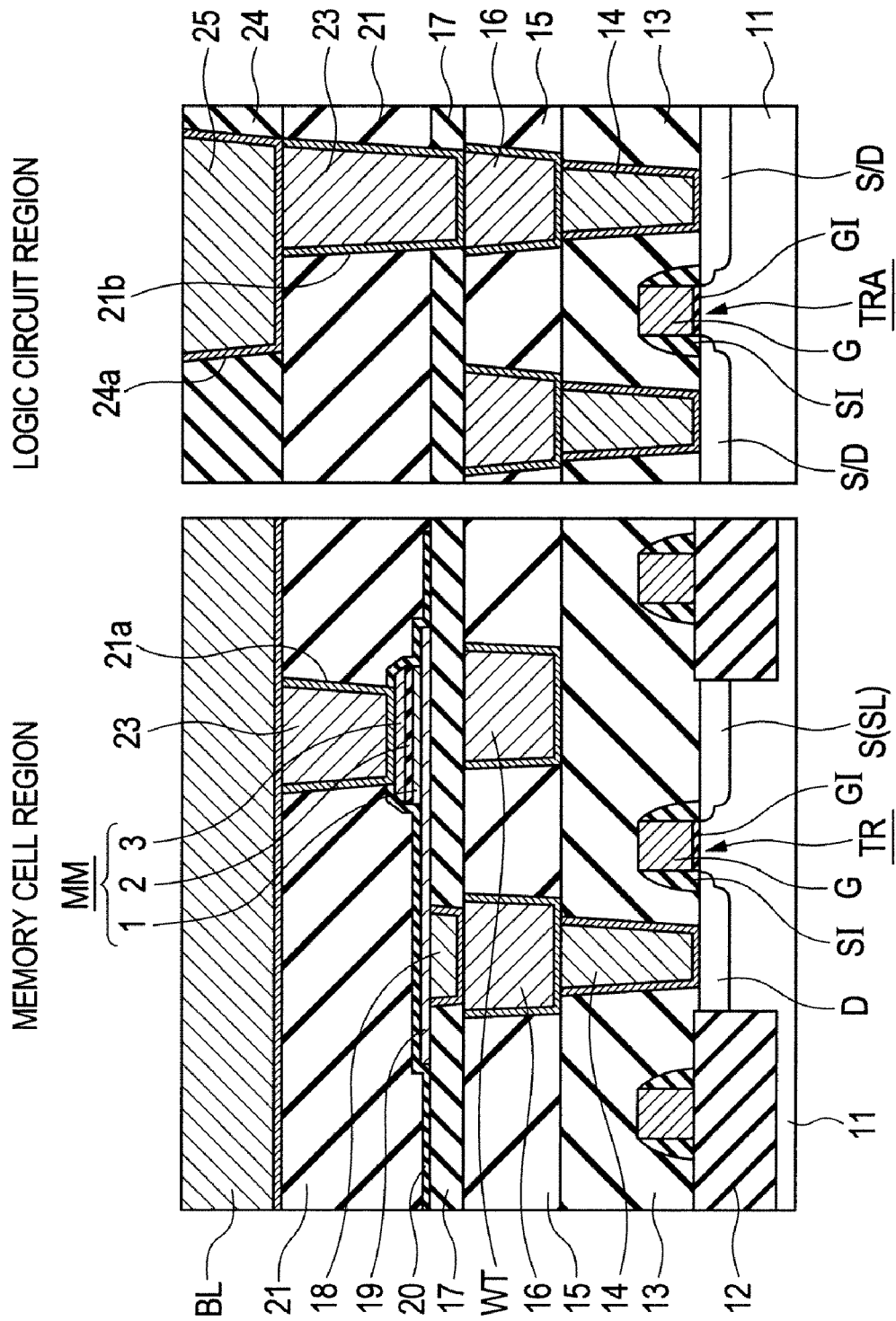
FIG. 11 is a schematic sectional view showing a fifth process step of the method shown in FIG. 7.

Referring to FIG. 11, in order to prevent the ferromagnetic tunnel junction element MM from being damaged by the subsequent process, the protective film 20 is formed in such a manner as to cover the ferromagnetic tunnel junction element MM. Further, the interlayer insulating film 21 is formed over the interlayer insulating film 17 by, for example, a CVD method in such a manner as to cover the protective film 20. In the memory cell region MR, the interlayer insulating film 21 and the protective film 20 are subjected to a prescribed photomechanical process and etching, thereby to form a contact hole 21a exposing the surface of the recording layer 3. In the peripheral circuit region RR, the interlayer insulating film 21 and the interlayer insulating film 17 are subjected to a prescribed photomechanical process and etching, thereby to form a contact hole 21b reaching the surface of the wiring layer 16. A copper layer (not shown) is formed over the interlayer insulating film 21 in such a manner as to fill the insides of the contact holes 21a and 21b. The copper layer is subjected to, for example, a CMP process or the like, thereby to remove the copper layer located over the top side of the interlayer insulating film 21. Thus, the copper layer is left in each of the insides of the contact holes 21a and 21b to form the coupling member 23.

The interlayer insulating film 24 is further formed over the interlayer insulating film 21 by, for example, a CVD method in such a manner as to cover the interlayer insulating film 21. The interlayer insulating film 24 is subjected to a prescribed photomechanical process and etching, so that in the memory cell region MR, an opening for forming the bit line is formed in the interlayer insulating film 24. In the peripheral circuit region RR, an opening 24a is formed in the interlayer insulating film 24. For example, a copper layer (not shown) is formed over the interlayer insulating film 24 in such a manner as to fill the insides of these openings. The copper layer is subjected to, for example, a CMP process, thereby to remove the copper layer located over the top side of the interlayer insulating film 24. Thus, in the opening for the bit line, the copper layer is left to form the bit line BL. In the opening 24a, the copper layer is left to form the wiring layer 25.

Incidentally, the single damascene method has been explained in the foregoing description. However, after the formation of the interlayer insulating film 21, the interlayer insulating film 24 is further formed. In those interlayer insulating films 21 and 24, prescribed coupling member and wiring layer may be formed with a dual damascene method. In this case, first, the interlayer insulating film 24 is subjected to a prescribed photomechanical process and etching. Thus, in the memory cell region MR, an opening (not shown) for forming the bit line is formed. In the peripheral circuit region RR, an opening 24a for forming the wiring layer is formed. Then, the interlayer insulating film 21 is subjected to a prescribed photomechanical process and etching. Thus, in the memory cell region MR, a contact hole 21a reaching the surface of the recording layer 3 in the ferromagnetic tunnel junction element MM is formed. In the peripheral circuit region RR, a contact hole 21b reaching the surface of the wiring layer 16 is formed. Incidentally, the opening 24a and the like may be formed in the interlayer insulating film 24 after the formation of the contact holes in the interlayer insulating films 21 and 24.

Then, for example, a copper layer (not shown) is formed over the interlayer insulating film 24 in such a manner as to fill the insides of the contact holes 21a and 21b, and the openings 24a, and the like. The copper layer is subjected to, for example, a CMP process, thereby to remove the portion of the copper layer located over the top side of the interlayer insulating film 24. Thus, in the memory cell region MR, the coupling member 23 embedded in the contact hole 21a, which is electrically coupled to the recording layer 3, is formed. In addition, in the opening, the bit line BL to be electrically coupled to the coupling member 23 is formed. Incidentally, even though the coupling member 23 is not used, there is no problem so long as the bit line BL and the recording layer 3 can be electrically coupled. On the other hand, in the peripheral circuit region RR, the coupling member 23 to be electrically coupled to the wiring layer 16 is formed in the contact hole 21b. Further, in the opening 24a, the wiring layer 25 to be electrically coupled to the coupling member 23 is formed.

Referring to FIG. 2, the interlayer insulating film 26 is further formed over the interlayer insulating film 24 in such a manner as to cover the bit line BL and the wiring layer 25 formed in the foregoing description. In the peripheral circuit region RR, a hole is formed in the interlayer insulating film 26, and the coupling member 27 is formed in the hole. Over the interlayer insulating film 26, the interlayer insulating film 28 is further formed. An opening is formed in the interlayer insulating film 28, and the wiring layer 29 is formed in the opening.

Incidentally, although the single damascene method has been explained in the foregoing description, the interlayer insulating film 28 is further formed after the formation of the interlayer insulating film 26, and in the interlayer insulating films 26 and 28, the coupling member 27 and the wiring layer 29 may be formed by the dual damascene method in the same manner as described above.

The magnetic memory device MD of the present embodiment is manufactured in the above-described manner.

Incidentally, in the manufacturing method of the magnetic memory device MD described above, a description has been given by taking the tungsten layer as an example of the coupling member 14 or the like. However, for example, silicon may be applied thereto. Alternatively, a metal such as copper, titanium, or tantalum or the like may also be applied thereto. Further, alloys of such metals, nitrides of such metals, and the like can also be applied thereto. Although a description has been given by taking the CMP method or the RIE method as an example of the method of forming the coupling member 14, or the like, for example, a plating method, a sputtering method, or a CVD method or the like may be applied thereto. When copper is applied as a metal, a so-called damascene method can be applied thereto. Thus, the wiring layer can also be formed in parallel with the coupling member 14.

Further, although a description has been given by taking the single damascene method as an example of the method of forming the write line WT, the dual damascene method can be applied thereto when the write line WT is formed simultaneously with the coupling member 14. Further, by applying a metal such as silicon, tungsten, aluminum, or titanium, an alloy of such a metal, or a compound of such a metal as the wiring material, the formation of wiring by dry etching also becomes possible.

The film thickness of the interlayer insulating film interposed between the wiring layer and the wiring layer varies according to the application device. In the magnetic memory device MD, however, the film thickness is, for example, about 40 nm.

Although a description has been given by taking an aluminum oxide as an example for the tunnel insulating layer 2 of the ferromagnetic tunnel junction element MM, a non-magnetic material is preferable as the tunnel insulating layer 2. For example, an oxide of a metal such as aluminum, silicon, tantalum, or magnesium, a nitride of the metal, an alloy oxide of the metal typified by silicate or the like, or a nitride of the alloy, or the like is preferable as the tunnel insulating layer 2. Further, the tunnel insulating layer 2 is preferably formed as a relatively thin film with a film thickness of about 0.3 to 5 nm. Incidentally, when a non-magnetic metal material is used in place of the tunnel insulating layer 2, it is also possible to use a so-called giant magnetoresistive effect in the direction perpendicular to the film plane.

Further, as the pinned layer 1 of the ferromagnetic tunnel junction element MM, the lamination structure of the platinum manganese alloy film and the cobalt iron alloy film has been taken as an example. Whereas, as the recording layer 3, the nickel iron alloy film has been taken as an example. However, for the pinned layer 1 and the recording layer 3, for example, a ferromagnetic material containing nickel, iron, and/or cobalt as a main component is preferable. Further, for the improvement of the magnetic characteristics and the thermal stability of the ferromagnetic material, additives such as boron, nitrogen, silicon, and molybdenum may be introduced into the ferromagnetic material. Particularly, for the recording layer 3, the improvement/stabilization of the magnetic characteristics thereof can also be achieved by the following manner: For the recording layer 3, a crystalline material thin film having a crystal structure of body-centered cubic type, rutile type, sodium chloride type, or zincblende type for improving the magnetic characteristics of the recording layer 3 is stacked over the recording layer 3; and/or an oxidation preventive film of tantalum, ruthenium, or the like is stacked thereon. Further, it is also possible to apply NiMnSb, $Co_2Mn$ (Ge, Si), $Co_2Fe$(Al, Si), $(Zn, Mn)Fe_2O_4$, or the like, which is referred to as a half-metal. In the half-metal, an energy gap exists in one spin band, which can therefore provide very large magnetic effects. As a result, a large signal output can be obtained.

The pinned layer 1 is formed in a lamination structure of the antiferromagnetic layer and the ferromagnetic layer. Thus, the magnetization direction thereof can be more fixed. In other words, the antiferromagnetic layer fixes the direction of the spin of the ferromagnetic layer, so that the direction of magnetization of the ferromagnetic layer is kept constant. A compound of at least one of a ferromagnetic material such as iron or noble metals, and manganese is preferable as for the antiferromagnetic layer.

Incidentally, in the manufacturing method referred to above, the case where the pinned layer 1, the tunnel insulating layer 2, and the recording layer 3 are respectively formed by a sputtering method has been taken as an example. However, it is also possible to respectively form the pinned layer 1, the tunnel insulating layer 2, and the recording layer 3 by, for example, a MBE (Molecular Beam Epitaxy) method, a chemical vapor growth method, or a vapor deposition method, other than the sputtering method.

Further, in the manufacturing method of the magnetic memory device MD, a description has been given to the case where the conductive layer 19 is provided between the pinned layer 1 of the ferromagnetic tunnel junction element MM and the coupling member 18. However, the pinned layer 1 and the coupling member 18 may also be directly coupled to each other. Alternatively, there may be adopted the structure that the wiring layer 16 and the conductive layer 19 are directly coupled to each other without interposing the coupling member 18 therebetween. In this case, the conductive layer 19 may be formed in the same shape as the planar shape of the pinned layer 1 so as to overlap the pinned layer 1 in a plan view. As the material for the conductive layer 19, a low resistance metal such as platinum, ruthenium, copper, aluminum, or tantalum is preferably applied. On the other hand, the film thickness of the conductive layer 19 is preferably set to, for example, 300 nm or less in order to prevent the impairment of the flatness of the pinned layer 1, the tunnel insulating layer 2, and the recording layer 3 to be formed over the conductive layer.

Incidentally, when the pinned layer 1 and the recording layer 3 are formed with the same size in a plan view, the conductive layer 19 needs to be formed larger, in a plan view, than the pinned layer 1 in such a manner that the conductive layer 19 is coupled to the coupling member 14. Thus, there is no problem even if the conductive layer 19 is formed larger than the pinned layer 1 on a planar basis.

Thus, a prescribed conductive layer 19 is allowed to exist between the interlayer insulating film 15 and the ferromagnetic tunnel junction element MM. As a result, when the coupling member 18 is formed of, for example, copper, the coupling member 18 of copper can also be prevented from being corroded during patterning of the ferromagnetic tunnel junction element MM by etching. Further, a material having a lower resistance than the resistance of the pinned layer 1 is applied to the conductive layer 19. This can reduce the resistance of the path of an electric current upon reading, which can also attain an improvement in the reading speed.

Further, in the magnetic memory device MD of the present embodiment, a description has been given by taking as an example, the case where in order to prevent the ferromagnetic tunnel junction element MM from being damaged in the process steps after the formation of the ferromagnetic tunnel junction element MM, the protective film 20 is formed in such a manner as to cover the ferromagnetic tunnel junction element MM. Examples of the damage which the ferromagnetic tunnel junction element MM may suffer during the manufacturing steps include one by the heat treatment for forming the interlayer insulating film. When a silicon oxide film is formed as the interlayer insulating film, the silicon oxide film is formed under an oxidizing atmosphere at about 400° C. or so.

At this time, the magnetic film may be oxidized under the oxidizing atmosphere. As a result, the magnetic characteristics of the ferromagnetic tunnel junction element MM may be deteriorated. By covering the ferromagnetic tunnel junction element MM with the protective film 20 such as a silicon nitride film or an aluminum oxide film, the protective film 20 can function as the barrier against the oxidation and thereby protect the ferromagnetic tunnel junction element MM.

In order to prevent such oxidation, the interlayer insulating film may be configured in a two-layer structure of a thin film depositable under a non-oxidizing atmosphere such as a silicon nitride film, and an oxidizing insulating film. In this case, of the two-layer structure interlayer insulating film, the silicon nitride film serves as the protective film of the ferromagnetic tunnel junction element MM.

Further, the protective film 20 is preferably a film containing at least one material of an insulating metal nitride, an insulating metal carbide, and a metal oxide formed by the oxidation treatment of a metal having a lower oxide forming free energy than that of Fe. By using such a material, it is possible to prevent the oxidation of the ferromagnetic tunnel junction element MM during the oxidation step in the manufacturing steps of the magnetic memory device using a magnetic material thin film containing at least Fe. As a result, it is possible to obtain a magnetic memory device which is easy to manufacture and is stable in operation characteristics.

Operation And Effect

The operation and effect of the present embodiment will next be described.

First, a description will be made of the case (half-selection state by write line WT) in which another magnetic memory element ME located over the same write line WT as the magnetic memory element ME subjected to writing upon a write operation is selected. In the half-selection state, the magnetic field in the direction of the hard-axis 92 due to a write line current IWT flowing through the write line WT is applied to the recording layer 3.

Figure 13:
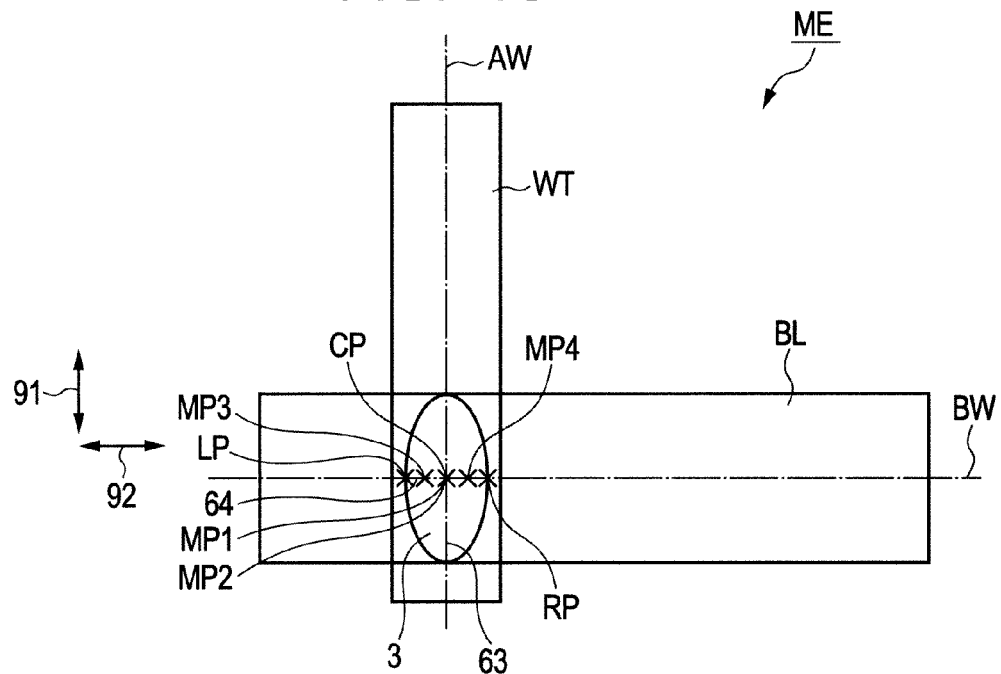
FIG. 13 is a diagram for explaining the position of a recording layer according to a first comparative example of the first embodiment of the present invention and is a diagram of a magnetic memory element as viewed from its lamination direction.

A description will first be given to magnetization of a recording layer in a half-selection state by a write line WT employed in a first comparative example of the present embodiment. Referring to FIG. 13, the recording layer 3 of the first comparative example has a shape similar to that in the present embodiment. In the first comparative example, the center point CP of the recording layer 3 lies on a first midpoint MP1 and a second midpoint MP2. Namely, the center point CP exists in the point of intersection between a bit line BL and its corresponding write line WT.

Figure 14:
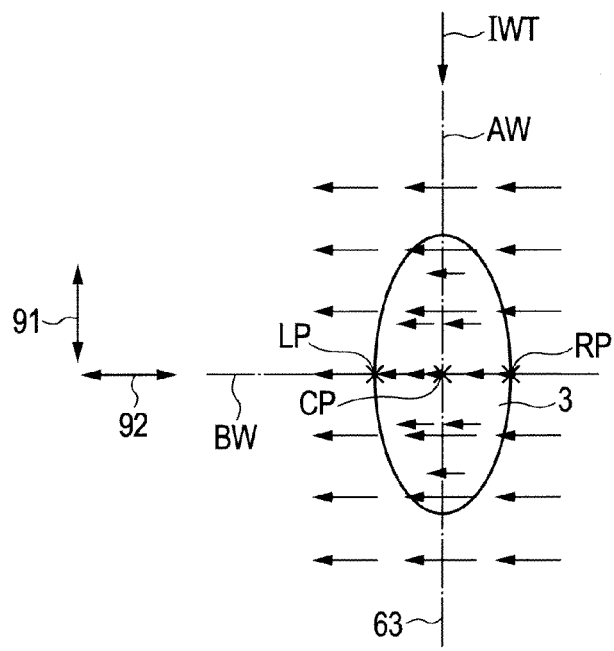
FIG. 14 is a schematic plan view showing a magnetization distribution in the recoding layer where a magnetic field is generated by a write line current in the first comparative example of the first embodiment of the present invention.

Referring to FIG. 14, a description will be given to a distribution of magnetization in the recoding layer 3 where a write line current IWT sufficiently large with respect to the recording layer 3 employed in the first comparative example shown in FIG. 13 flows thereby to generate a magnetic field within the plane of the recording layer 3. In this case, the magnetic field uniform substantially is applied within the plane of the recording layer 3, so that all magnetization of the recording layer 3 are saturated in the direction of the magnetic field by the write line current IWT. When the write line current IWT reaches 0 in this state, the magnetization of the recording layer 3 turns upward or downward in the drawing along an easy-axis 91, but their probabilities become ideally 1/2. Namely, it is not possible to hold information because the magnetization of the recording layer 3 cannot be controlled due to the magnetization of the recording layer 3 being saturated. Accordingly, the inversion of data erroneously occurs in the half-selection state by the write line WT.

Subsequently, a description will be given to the magnetization of the recording layer 3 in the half-selection state by the write line WT in the present embodiment. Incidentally, the write line current IWT is assumed to have magnitude similar to that in the first comparative example.

Figure 15:
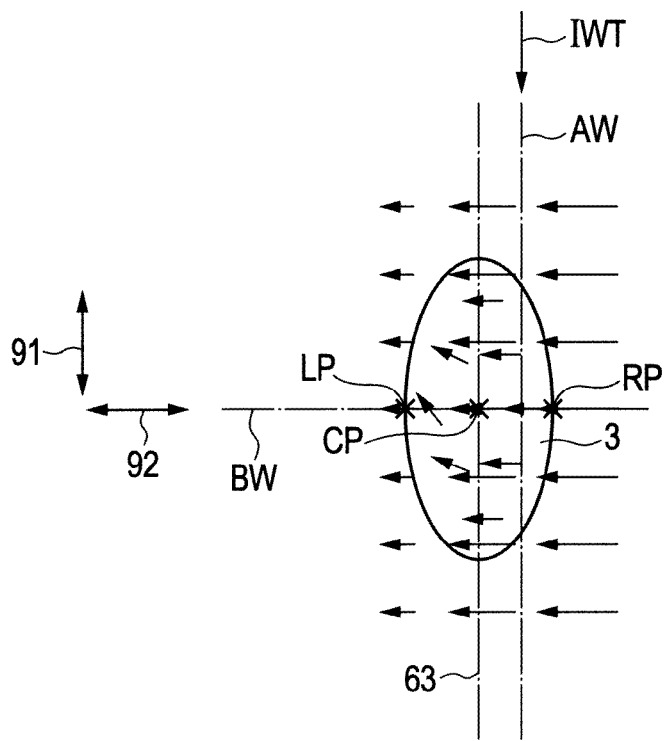
FIG. 15 is a schematic plan view showing a magnetization distribution in the recording layer where a magnetic field is generated by a write line current in the first embodiment of the present invention.

Referring to FIG. 15, the center point CP of the recording layer 3 in the present embodiment is located with being shifted from the virtual center line AW of the write line WT. Therefore, a non-uniform magnetic field is applied in the direction of the hard-axis 92 in the recording layer 3. Incidentally, since the center point CP lies on the virtual center line BW of the bit line BL, the magnetic field on the virtual first straight line 63 extending along the direction of the easy-axis 91 is substantially uniform.

Thus, the magnetization is not saturated at the other portion (one end LP side) of the recording layer 3, but assumes a magnetization distribution asymmetric with respect to the virtual first straight line 63. This is because at the other portion of the recording layer 3, the magnetic field generated by the write line current IWT is small and the direction of magnetization taken before the write line current IWT flows is maintained. In this case, even when the passage of the write line current IWT is stopped (when the write line current IWT is brought to 0), the information originally held by the magnetic memory element ME is maintained.

According to the magnetic memory element ME of the present embodiment, the planar shape of the recording layer 3 as viewed from the lamination direction has one portion located on one side and the other portion located on the other side with respect to the first center line AW along the direction in which the write line WT extends as viewed from the lamination direction. The area S2 of one portion as viewed from the lamination direction is less than or equal to one third the area S1 of the other portion. Thus, the magnetization reversal of the recording layer 3 brought to the half-selection state can be brought to nearly 0. Accordingly, erroneous inversion of data in the magnetic memory element ME brought to the half-selection state can be suppressed. It is thus possible to perform a highly reliable write operation. The reason therefor will be explained in detail below.

Table 1 shows the relationship between the ratio (S2/S1) of the area S2 of one portion to the area S1 of the other portion, and the saturation bit probability. Incidentally, the bit means one magnetic memory element ME. The saturation bit probability shows the probability at which the magnetization of the recording layer 3 is saturated in the half-selection state by the write line WT.

The saturation bit probabilities were determined as follows: As for the magnetic field generated in the film surface of the recording layer 3, Maxwell's equations were solved for every coordinate (electromagnetic field analysis) thereby to calculate the magnetic field in the plane of the recording layer 3 when the write line current IWT was made to flow therethrough. Assuming that the distribution of the saturation magnetic field of the recording layer 3 confirms to the normal distribution, the probability of presence of each bit having reached the saturation magnetic field was calculated for each position. Incidentally, for the write line current IWT used in the calculation, the values at which all bits on the write line WT can be saturated were used for convenience. The saturation bit probabilities were determined in this way.

TABLE 1

| Area ratio (S2/S1) | Saturation bit probability |
|---|---|
| 1.00 | 1.0 |
| 0.95 | 1.0 |
| 0.90 | 1.0 |
| 0.86 | 1.0 |
| 0.82 | 1.0 |
| 0.77 | 1.0 |
| 0.74 | 1.0 |
| 0.70 | $9.9 \times 10^{-1}$ |
| 0.66 | $9.9 \times 10^{-1}$ |
| 0.63 | $9.8 \times 10^{-1}$ |
| 0.60 | $9.8 \times 10^{-1}$ |
| 0.57 | $9.7 \times 10^{-1}$ |
| 0.54 | $9.4 \times 10^{-1}$ |
| 0.51 | $8.8 \times 10^{-1}$ |
| 0.48 | $7.7 \times 10^{-1}$ |
| 0.45 | $6.6 \times 10^{-1}$ |
| 0.43 | $4.5 \times 10^{-1}$ |
| 0.40 | $1.5 \times 10^{-1}$ |
| 0.38 | $2.7 \times 10^{-2}$ |
| 0.36 | $7.2 \times 10^{-3}$ |
| 0.34 | $1.3 \times 10^{-3}$ |
| 0.32 | $5.8 \times 10^{-5}$ |
| 0.30 | $5.9 \times 10^{-7}$ |
| 0.28 | $2.3 \times 10^{-9}$ |
| 0.26 | $6.4 \times 10^{-11}$ |
| 0.24 | $8.6 \times 10^{-13}$ |
| 0.23 | $1.4 \times 10^{-15}$ |
| 0.21 | 0.0 |
| 0.19 | 0.0 |
| 0.18 | 0.0 |
| 0.17 | 0.0 |
| 0.15 | 0.0 |
| 0.14 | 0.0 |
| 0.13 | 0.0 |
| 0.12 | 0.0 |
| 0.10 | 0.0 |
| 0.09 | 0.0 |
| 0.08 | 0.0 |
| 0.07 | 0.0 |
| 0.06 | 0.0 |
| 0.05 | 0.0 |
| 0.05 | 0.0 |
| 0.04 | 0.0 |
| 0.03 | 0.0 |
| 0.03 | 0.0 |
| 0.02 | 0.0 |
| 0.01 | 0.0 |
| 0.01 | 0.0 |
| 0.00 | 0.0 |
| 0.00 | 0.0 |
| 0.00 | 0.0 |

Figure 16:
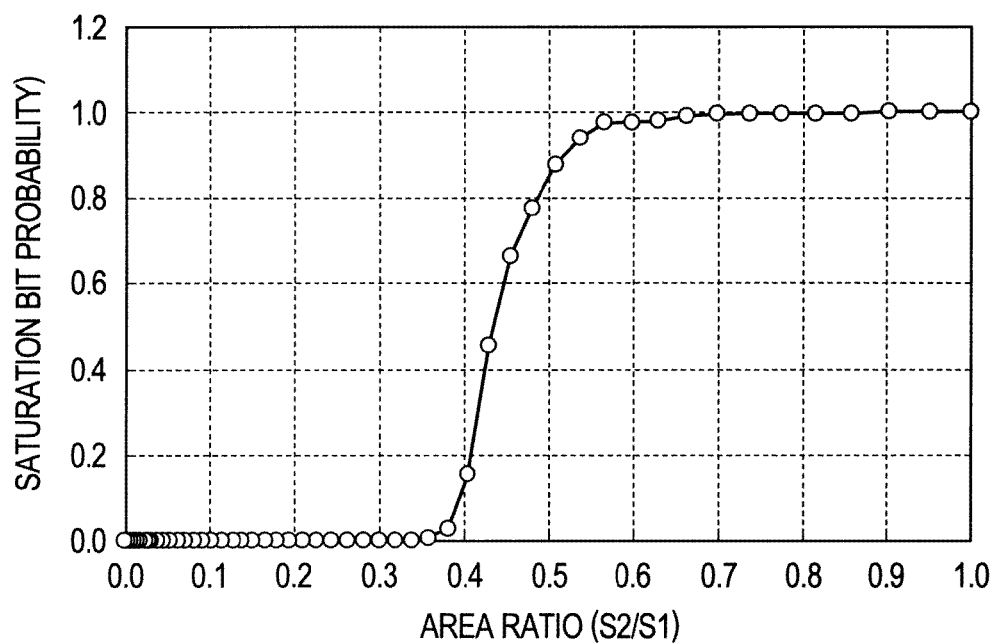
FIG. 16 is a diagram showing the relationship between a saturation bit probability of the magnetic memory element employed in the first embodiment of the present invention and its area ratio.

FIG. 16 shows the respective values of Table 1. Referring to FIG. 16 and Table 1, when the area ratio (S2/S1) between the area S1 of one portion and the area S2 of the other portion is 1/3 or less, the saturation bit probability indicative of the rate at which the magnetization of the recording layer 3 is saturated in the half-selection state by the write line WT, becomes nearly 0. There could therefore be obtained the findings that the erroneous inversion of the data could be suppressed in the half-selection state by the write line WT.

According to the magnetic memory element ME of the present embodiment, the recording layer 3 is formed in such a manner that the magnetization is not saturated where only the magnetic field formed by the write line WT acts thereon. It is therefore possible to suppress the erroneous inversion of the data of the magnetic memory element ME brought to the half-selection state.

Then, a description will be given to the case where the magnetic memory device ME is selected upon the write operation.

A component on the same surface as the recording layer 3, of the magnetic field generated from the write line WT becomes maximum in the neighborhood directly located on the virtual first center line AW of the write line WT.

Figure 17:
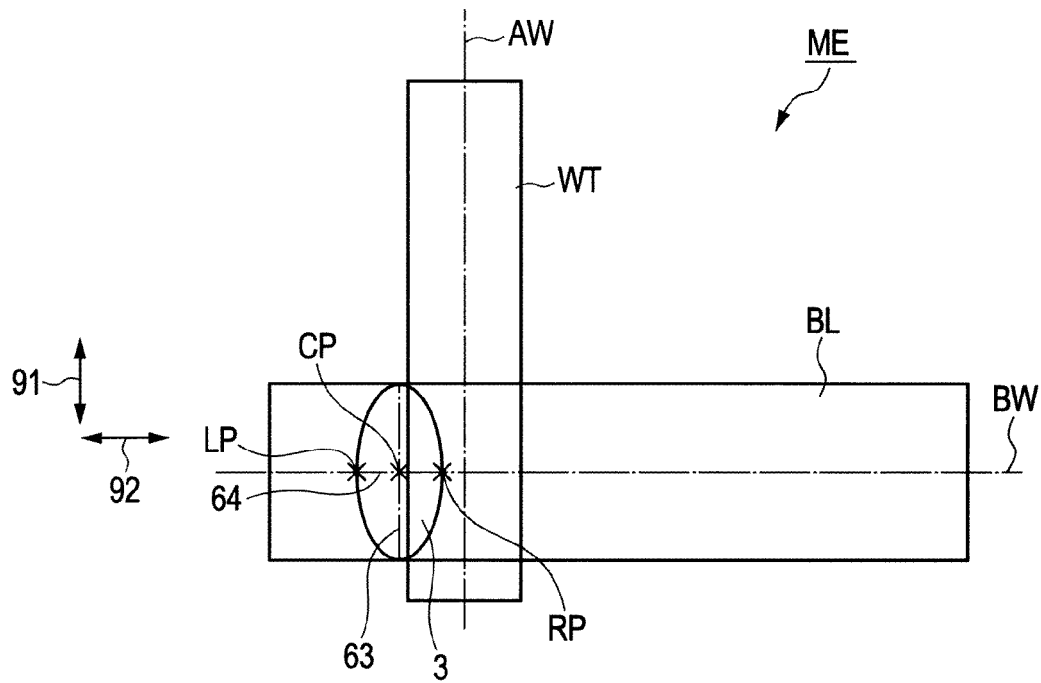
FIG. 17 is a diagram for explaining the position of a recording layer according to a second comparative example of the first embodiment of the present invention and is a diagram of a magnetic memory element as viewed from its lamination direction.

Referring to FIG. 17, in a second comparative example of the present embodiment, a center point CP is not located between a write line WT and a bit line BL as viewed from the direction of lamination thereof, and a virtual first center line AW of the write line WT is not located between the center point CP and the other end RP. Since, in this case, the maximum magnetic field in the direction of the film surface of a recording layer 3, which is generated by a write line current IWT, is not applied to the recording layer 3, the write line current IWT necessary for the write operation increases. Further, since the center point CP does not exist between the write line WT and the bit line BL as viewed from the lamination direction, the magnetic field applied to the center of the recording layer 3 becomes small, so that the write line current IWT necessary for the write operation increases.

On the other hand, according to the magnetic memory element ME of the present embodiment, the center point CP is located in the region interposed between the write line WT and the bit line BL as viewed from the lamination direction and disposed with being shifted from the first center line AW of the write line WT as viewed from the lamination direction. Therefore, the maximum magnetic field generated by the write line current IWT is applied to the inside of the recording layer 3. Thus, the write operation is enabled even without increasing the write line current IWT. It is therefore possible to suppress an increase in the write line current IWT at the write operation. Accordingly, the erroneous inversion of data in the magnetic memory device ME brought to the half-selection state can be suppressed without increasing the write line current IWT.

According to the magnetic memory element ME of the present embodiment as well, the center point CP is located on the virtual second center line BW of the bit line BL along the direction in which the bit line BL extends as viewed from the lamination direction. For that, the magnetic field applied to the center of the recording layer 3 by the electric current of the bit line BL upon the write operation increases. It is therefore possible to suppress an increase in the electric current of the bit line BL at the write operation. Accordingly, an increase in the synthetic magnetic field generated by the electric current of the bit line BL and the write line current IWT can be suppressed.

From the above description, it is desirable that the virtual first center line AW of the write line WT passes through the neighborhood of each of the midpoints between the center point CP and one end LP and between the center point CP and the other end RP in order to suppress the increase in the write line current IWT and prevent the saturation of magnetization of the recording layer 3. Further, since the center point CP is required to lie between the write line WT and the bit line BL in the lamination direction, it is desirable that the width of the write line WT is larger than the distance between the center point CP and one end LP and the distance between the center point CP and the other end RP. When, however, the width of the write line WT is excessively wider, a substantially uniform magnetic field is generated in the recording layer 3 by the write line current IWT, and thereby the magnetization of the recording layer 3 is saturated.

Figure 18:
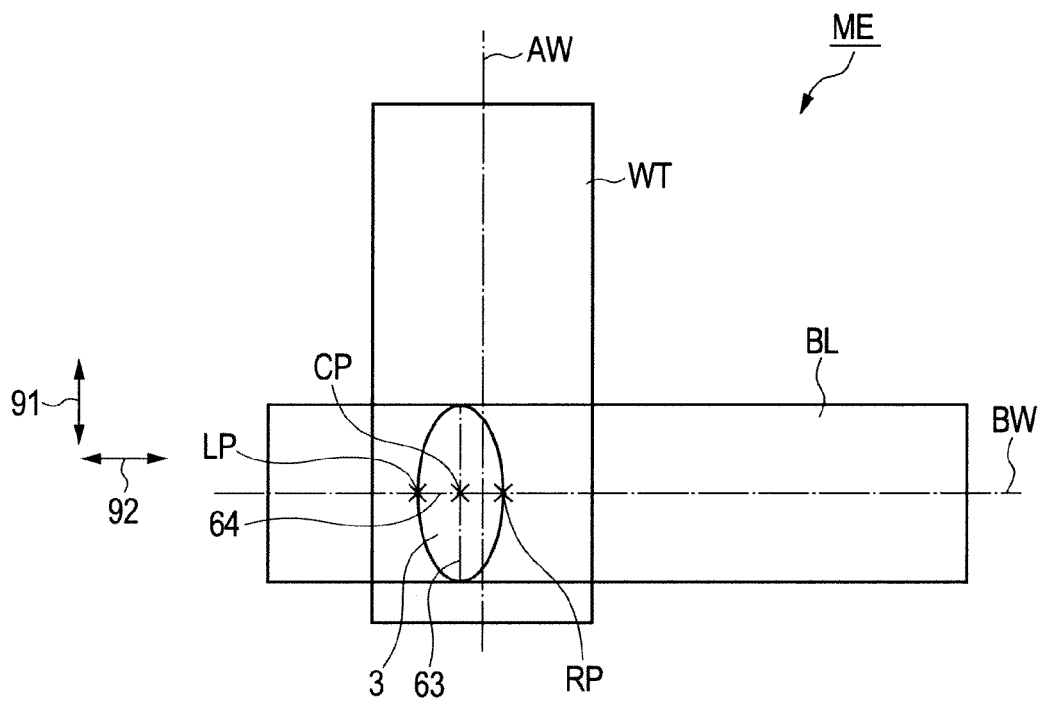
FIG. 18 is a diagram for explaining the position of a recording layer according to a third comparative example of the first embodiment of the present invention and is a diagram of a magnetic memory element as viewed from its lamination direction.

Referring to FIG. 18, in the second comparative example of the present embodiment, the width of the write line WT is 2.5 times the distance between one end LP of the recording layer 3 and the other end RP thereof. In this case, the substantially uniform magnetic field is generated in the recording layer 3.

According to the magnetic memory element ME of the present embodiment, the width of the write line WT as viewed from the lamination direction is larger than both the distance between the center point CP and one end LP and the distance between the center point CP and the other end RP and smaller than the distance equal to twice the distance between one end LP and the other end RP. Further, as viewed from the lamination direction, the first center line AW of the write line WT passes through either the third midpoint MP3 between the center point CP and one end LP or the fourth midpoint MP4 between the center point CP and the other end RP.

Thus, since the width of the write line WT as viewed from the lamination direction is larger than both the distance between the center point CP and one end LP and the distance between the center point CP and the other end RP, the center point CP can be located between the write line WT and the bit line BL in the lamination direction. Since the width of the write line WT as viewed from the lamination direction is smaller than the distance equal to twice the distance between one end LP and the other end RP, it is possible to prevent the substantially uniform magnetic field from being generated in the recording layer 3. Since the first center line AW of the write line WT passes through either the third midpoint MP3 between the center point CP and one end LP or the fourth midpoint MP4 between the center point CP and the other end RP as viewed from the lamination direction, the saturation of magnetization of the recording layer 3 can be prevented while suppressing the increase in the write line current IWT.

According to the magnetic memory element ME of the present embodiment, there is further provided the covering layer HR which covers the write line WT and is comprised of the material having magnetic permeability higher than that of the write line WT. Thus, a steep magnetic field distribution is obtained because the magnetic flux generated from the write line WT concentrates. Therefore, the erroneous inversion of the data in the magnetic memory element ME brought to the half-selection state can be prevented while further suppressing the increase in the write line current IWT.

According to the magnetic memory device MD of the present embodiment, it includes the magnetic memory element ME and the element selection transistor TR for controlling the magnetic memory element ME. It is thus possible to provide a magnetic memory device MD using a magnetic memory element ME, which is capable of performing a highly reliable write operation by suppressing the erroneous inversion of data in the magnetic memory element brought to a half-selection state.

According to the present embodiment, when the characteristics of each recording layer 3 vary within a matrix of an MRAM in particular, the reversal of magnetization of the recording layer 3 brought to the half-selection state can be prevented without increasing the write line current IWT. Therefore, from a practical standpoint, such a configuration that the inversion of data due to the fluctuations in the recording layer 3 of each of the magnetic memory elements ME arranged in matrix form can be suppressed is preferable.

(Second Embodiment)

A second embodiment of the present invention is mainly different from the first embodiment in terms of the shape of a recording layer 3.

Figure 19:
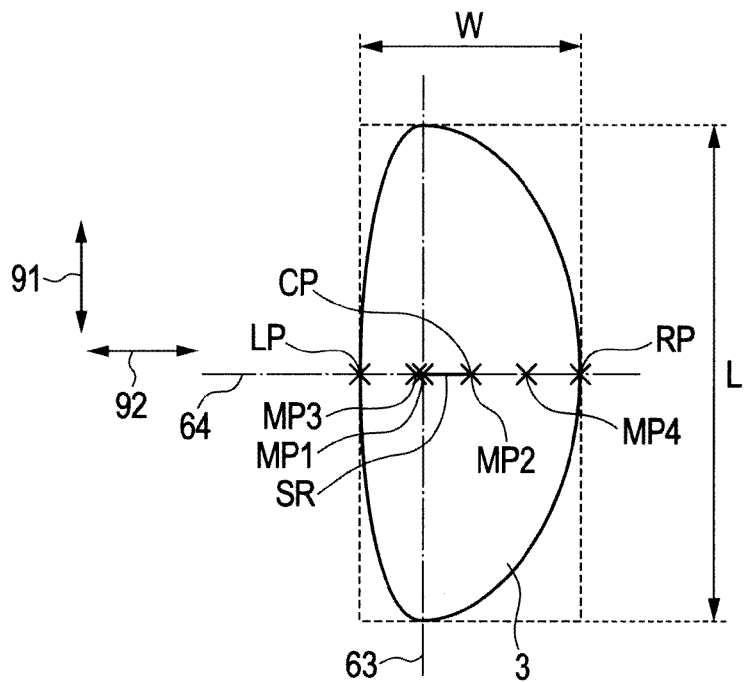
FIG. 19 is a schematic plan view showing a planar shape of a recording layer employed in a second embodiment of the present invention.

Referring to FIG. 19, the planar shape of the recording layer 3 employed in the present embodiment is asymmetrical with respect to a virtual first straight line 63. The recording layer 3 has a shape symmetrical with respect to a virtual second straight line 64. The region of a straight line interposed between a first midpoint MP1 and a center point CP is assumed to be a straight line region SR.

The planar shape of the recording layer 3 is formed in such a manner that the area of one end LP side becomes small and the area of the other end RP side becomes large with respect to the virtual first straight line 63.

Figure 20:
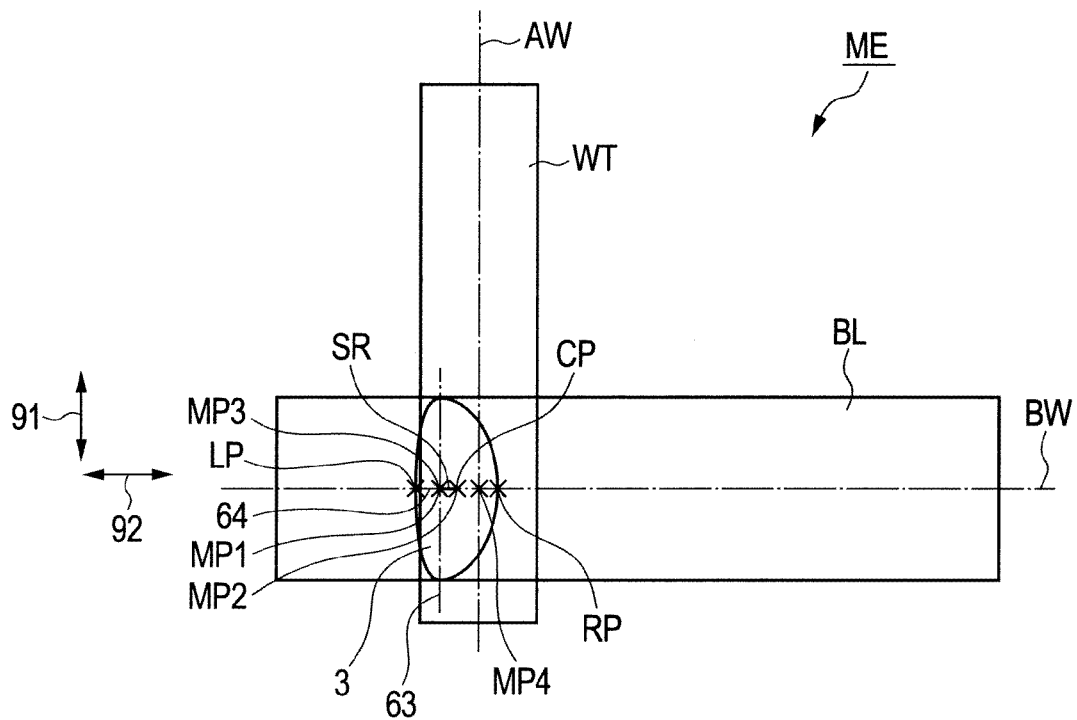
FIG. 20 is a diagram for explaining the position of the recording layer employed in the second embodiment of the present invention and is a diagram of a magnetic memory element as viewed from its lamination direction.

Referring to FIG. 20, the planar shape of the recording layer 3 is asymmetrical with respect to a virtual first center line AW of a write line WT as viewed from the lamination direction and located symmetrically with respect to a second center line BW of a bit line BL. The straight line region SR between the first midpoint MP1 and the center point CP is located in the region interposed between the write line WT and the bit line BL as viewed from the lamination direction. The straight line region SR is located in the position where it does not intersect with the virtual first center line AW of the write line WT as viewed from the lamination direction.

The first midpoint MP1 is located apart from the center point CP with respect to the virtual first center line AW of the write line WT. The virtual first center point AW of the write line WT passes over a midpoint MP4 between the center point CP and the other end RP. The other end RP is arranged with being interposed between the write line WT and the bit line BL as viewed from the lamination direction. One end LP is not arranged with being interposed between the write line WT and the bit line BL as viewed from the lamination direction.

Incidentally, since the configuration or the like of the present embodiment other than the foregoing is the same as the configuration of the first embodiment describe above. Therefore, the same elements are given the same reference numerals, and their description will not be repeated.

Figure 21:
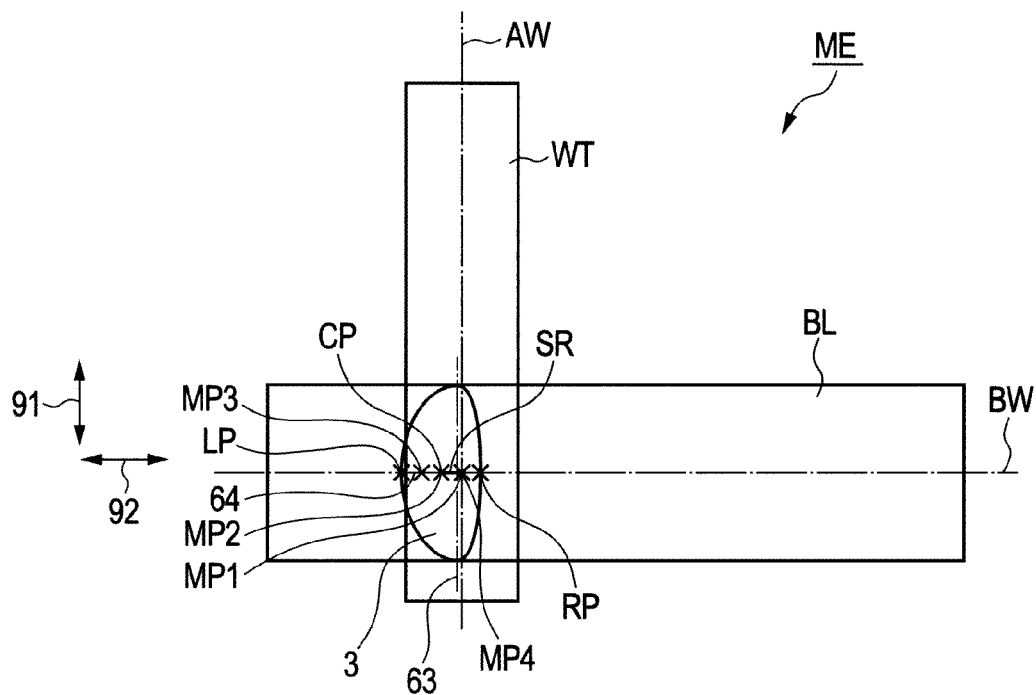
FIG. 21 is a diagram for explaining the position of a recording layer according to a first modification of the second embodiment of the present invention and is a diagram of a magnetic memory element as viewed from its lamination direction.

Referring to FIG. 21, a recording layer 3 according to a first modification of the present embodiment may be a shape linearly symmetrical with the recording layer 3 of the present embodiment with respect to the direction of the easy-axis 91. Since the distance between a first midpoint MP1 and the other end RP is small in the first modification, the degree of margin for its layout is low. Therefore, when a shift occurs in overlap between respective layers in the photolithography, for example, it is difficult to suppress the erroneous inversion of data in a magnetic memory element ME brought to a half-selection state. When it is taken into consideration, the present embodiment shown in FIG. 20 is preferable.

Figure 22:
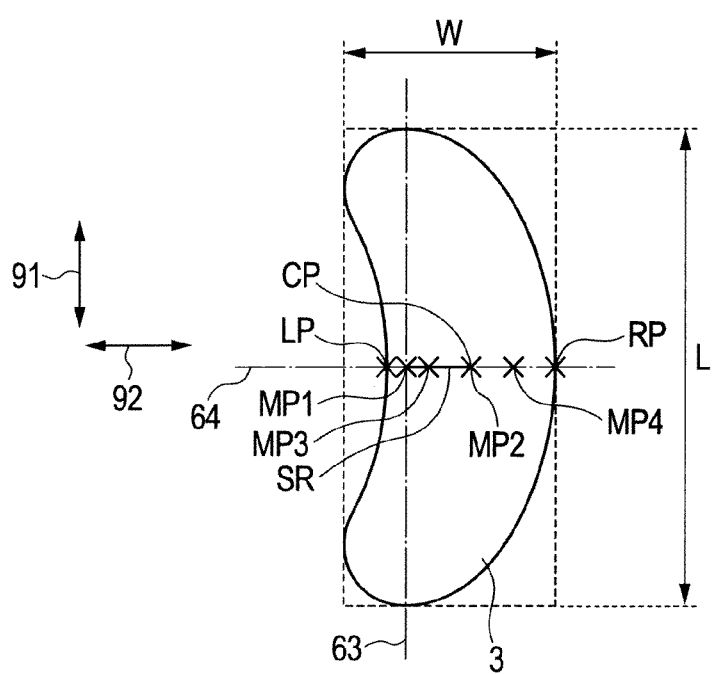
FIG. 22 is a schematic plan view showing a planar shape of a recording layer according to a second modification of the second embodiment of the present invention.
Figure 23:
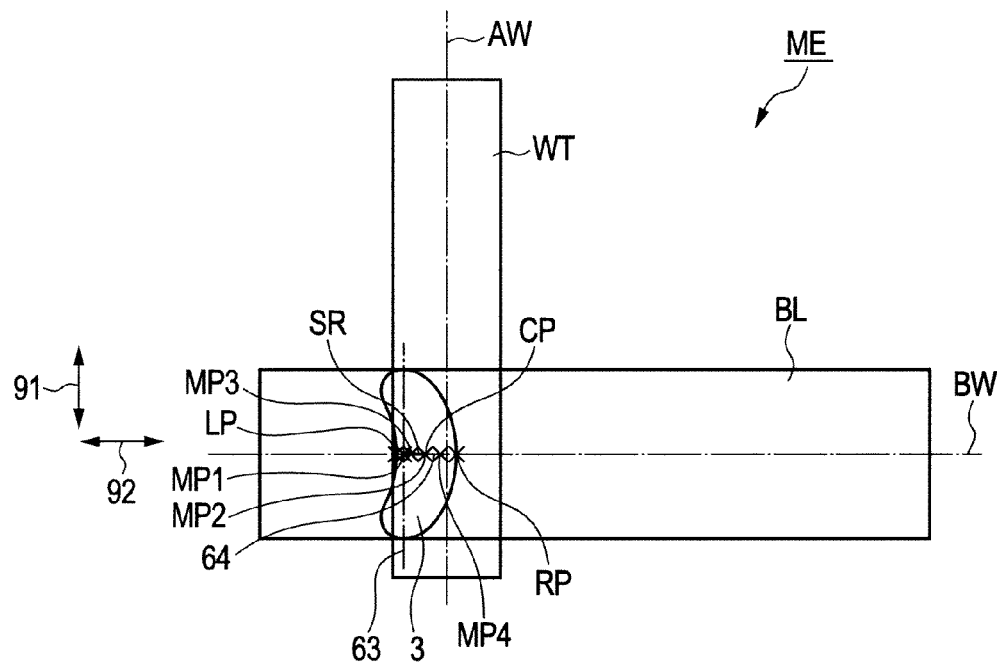
FIG. 23 is a diagram for explaining the position of a second modification of a magnetic memory element employed in the second embodiment of the present invention and is a diagram of a recording layer as viewed from its lamination direction.
Figure 24:
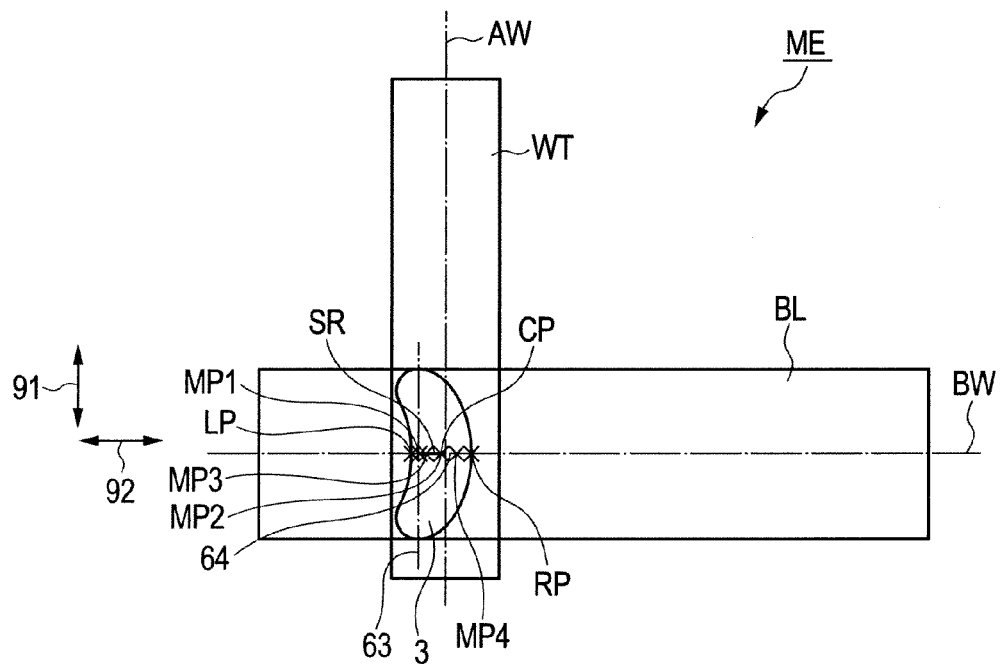
FIG. 24 is a diagram for explaining the position of a third modification of a magnetic memory element employed in the second embodiment of the present invention and is a diagram of a recording layer as viewed from its lamination direction.

Referring to FIG. 22, a recording layer 3 according to a second modification of the present embodiment may have a concave portion in the direction of a virtual second straight line 64. Referring to FIG. 23, in the second modification, one end LP is arranged between a write line WT and a bit line BL as viewed from the direction of lamination thereof. Whereas, both ends of the recording layer 3 in the direction extending along an easy-axis 91 are not arranged between the write line WT and the bit line BL in the lamination direction. Even in the second modification, the recording layer 3 may be a shape linearly symmetrical with respect to the direction of the easy-axis 91.

Referring to FIG. 23, in a recording layer 3 according to a third modification of the present embodiment, the whole of its planar shape may be interposed between a write line WT and a bit line BL as viewed from the direction of lamination thereof. In the present third modification, one end LP is disposed between the write line WT and the bit line BL as viewed from the lamination direction. In the third modification, even when a steplike-offset occurs in the manufacturing process step of the write line WT, the influence thereof can be prevented.

Then, the operation and effect of the present embodiment will be described.

In the present embodiment, as for the recording layer 3, the first midpoint MP1 corresponds to the midpoint of the virtual first straight line 63 having the maximum length L of the planar shape along the direction of the easy-axis 91. The center point CP lies in the second midpoint MP2 corresponding to the midpoint of the virtual second straight line 64 having the planar-shaped length W along the direction of the hard-axis 92. Thus, in the straight line region SR, the length thereof in the direction of the easy-axis 91 becomes long. Therefore, the effect of the magnetic field generated by the write line current IWT becomes large in the straight line region SR. Accordingly, the magnetic field can be applied to the straight line region SR corresponding to the region interposed between the first midpoint MP1 and the center point CP, thereby making it possible to perform efficient magnetization reversal at writing. Namely, when the recording layer 3 takes the shape asymmetrical with respect to the easy-axis 91, the straight line region SR that couples the first midpoint MP and the center point CP is considered in a manner similar to the center point CP in the first embodiment, thereby making it possible to obtain a similar advantageous effect.

According to the magnetic memory element ME of the present embodiment, since the planar shape of the recording layer 3 is asymmetric with respect to the first center line AW of the write line WT as viewed from the lamination direction, the magnetization distribution of the recording layer 3 becomes asymmetrical with respect to the easy-axis 91 due to the effect of magnetic anisotropy due to the shape. Therefore, the magnetization become more unsaturated on one end LP side or the other end RP side of the recording layer 3. Thus, since the shape of the recording layer 3 and the magnetic field applied by the write line current IWT are both asymmetrical with respect to the virtual first center line AW, the erroneous reversal of the recording layer 3 brought to the half-selection by the write line WT can be more prevented.

According to the magnetic memory element ME of the present embodiment as well, since the first midpoint MP1 is arranged apart from the center point CP with respect to the virtual first center line AW of the write line WT, the distance between one end LP or the other end RP and the straight line region SR can be ensured, whereby the degree of margin for the layout thereof becomes larger. Therefore, even when the shift occurs in overlap between the respective layers in the photolithography, for example, the erroneous inversion of data in the magnetic memory element ME brought to the half-selection state can be suppressed.

Further, according to the magnetic memory element ME of the present embodiment, the whole planar shape is interposed between the write line WT and the bit line BL as viewed from the lamination direction. Therefore, even when the steplike-offset occurs in the manufacturing process step of the write line WT, the influence thereof can be prevented.

In the foregoing magnetic memory element ME and magnetic memory device MD, a description has been given by taking one memory cell provided with one magnetic memory element ME as the example. One memory cell may however be provided with two or more magnetic memory elements ME. Alternatively, the respective memory cells may be laminated with each other.

The respective embodiments referred to above can suitably be combined together.

The embodiments disclosed this time are to be considered in all respects as illustrative and not restrictive. The scope of the invention is indicated by the appended claims rather than by the foregoing description, and all changes which come within the meaning and range of the claims and equivalency thereof are intended to be embraced therein.

What is claimed is:

1. A magnetic memory element comprising:
  a recording layer capable of changing in magnetization direction by an external magnetic field, and having an easy-axis and a hard-axis crossing with the easy-axis;
  a first conductive layer for forming a magnetic field in the direction crossing with the direction of the easy-axis at a layout position of the recording layer; and
  a second conductive layer extending in the direction crossing with the first conductive layer and for forming a magnetic field in the direction crossing with the direction of the hard-axis at the layout position of the recording layer,
  wherein the recording layer has at least a part placed so as to be interposed between the first conductive layer and the second conductive layer, and a planar shape of the recording layer as viewed from the direction in which the first and second conducive layers and the recording layer are laminated with each other, has one portion located on one side and the other portion located on the other side, with respect to a virtual first center line of the first conductive layer along the direction in which the first conductive layer extends as viewed from the lamination direction, and the area of the one portion as viewed from the lamination direction is less than or equal to one third that of the other portion, the recording layer is elliptical-shaped in plan view, a width of the recording layer along the hard-axis is less than or equal to a width of the first conductive layer, and a width of the recording layer along the easy-axis is less than or equal to a width of the second conductive layer.

2. The magnetic memory element according to claim 1, wherein when only the magnetic field formed by the first conductive layer acts on the recording layer, the recording layer is formed in such a manner that magnetization thereof is unsaturated.

3. The magnetic memory element according to claim 1, wherein the whole of the planar shape is interposed between the first conductive layer and the second conductive layer as viewed from the lamination direction.

4. The magnetic memory element according to claim 1, further comprising a covering layer which covers the first conductive layer and is comprised of a material having higher permeability than that of the first conductive layer.

5. A magnetic memory device comprising:
the magnetic memory element according to claim 1; and
a control element for controlling the magnetic memory element.

6. The magnetic memory element according to claim 1, wherein a virtual second straight line passes through a first midpoint of a virtual first straight line having the maximum length of the planar shape along the direction of the easy-axis and a center point, which lies in a second midpoint of the virtual second straight line having a length of the planar shape along the direction of the hard-axis, is located in a region interposed between the first conductive layer and the second conductive layer as viewed from the lamination direction, and the center point is located out of the first center line of the first conductive layer as viewed from the lamination direction.

7. The magnetic memory element according to claim 6, wherein the center point is located over a virtual second center line of the second conductive layer along the direction in which the second conductive layer extends as viewed from the lamination direction.

8. The magnetic memory element according to claim 6, wherein when both ends of the planar shape located over the second straight line are assumed to be one end and the other end, the width of the first conductive layer as viewed from the lamination direction is larger than both a distance between the center point and the one end and a distance between the center point and the other end, and smaller than a distance equal to twice the distance between the one end and the other end, and wherein as viewed from the lamination direction, the first center line of the first conductive layer passes through either of a third midpoint between the center point and the one end or a fourth midpoint between the center point and the other end.

9. The magnetic memory element according to claim 6, wherein the planar shape is located asymmetrically with respect to the first center line of the first conductive layer and symmetrically with respect to the second center line of the second conductive layer as viewed from the lamination direction, wherein a linear region between the first midpoint and the center point is located in the region interposed between the first conductive layer and the second conductive layer as viewed from the lamination direction and arranged in a position not crossing with the first center line of the first conductive layer as viewed from the lamination direction.

10. The magnetic memory element according to claim 9, wherein the first midpoint is located away from the center point with respect to the first center line of the first conductive layer.

11. A magnetic memory element comprising:
a recording layer capable of changing in magnetization direction by an external magnetic field, and having an easy-axis and a hard-axis crossing with the easy-axis;
a first conductive layer for forming a magnetic field in the direction crossing with the direction of the easy-axis at a layout position of the recording layer; and
a second conductive layer extending in the direction crossing with the first conductive layer and for forming a magnetic field in the direction crossing with the direction of the hard-axis at the layout position of the recording layer, wherein the recording layer has at least a part placed so as to be interposed between the first conductive layer and the second conductive layer, and a planar shape of the recording layer as viewed from the direction in which the first and second conducive layers and the recording layer are laminated with each other, has one portion located on one side and the other portion located on the other side, with respect to a virtual first center line of the first conductive layer along the direction in which the first conductive layer extends as viewed from the lamination direction, and the area of the one portion as viewed from the lamination direction is less than or equal to One third that of the other portion, and the recording layer is disposed so that a direction from one end of a second virtual straight line to an other end of the second virtual straight line is the magnetization direction formed by the first conductive layer, the one end of the second virtual straight line is not interposed between the first conductive layer and the second conductive layer as viewed from the lamination direction, and the other end of the second virtual line straight line is interposed between first conductive layer and the second conductive layer as viewed from the lamination direction.

* * * * *